United States Patent [19]

Tachibana

[11] Patent Number: 4,970,679
[45] Date of Patent: Nov. 13, 1990

[54] PULSE INPUT APPARATUS
[75] Inventor: Masayoshi Tachibana, Kawasaki, Japan
[73] Assignee: Kabushiki Kaisha Toshiba, Kawasaki, Japan
[21] Appl. No.: 198,304
[22] Filed: May 25, 1988
[30] Foreign Application Priority Data
 May 28, 1987 [JP] Japan ............................ 62-132215
[51] Int. Cl.⁵ ............................................. G06F 3/00
[52] U.S. Cl. ................................ 364/900; 364/942.7; 364/949.5
[58] Field of Search ... 364/200 MS File, 900 MS File
[56] References Cited
U.S. PATENT DOCUMENTS
 3,971,920 7/1976 Johnson ........................... 364/900
 4,222,103 9/1980 Chamberlin .
 4,259,719 3/1981 Edelman et al. .
 4,283,761 8/1981 Edelman et al. .
 4,445,192 4/1984 Haag et al. ....................... 364/900

Primary Examiner—Thomas M. Heckler
Attorney, Agent, or Firm—Oblon, Spivak, McClelland, Maier & Neustadt

[57] ABSTRACT

A pulse input apparatus comprises an input circuit for sampling each of input signals for a plurality of channels, an orthogonal memory for storing the sampled signal components of the input signals, sequentially in a direction of its time axis, and a sequencer for reading the sampled data items from the orthogonal memory, in a direction orthogonal to the time axis, to obtain a code representing the time at which the input signal has changed, in accordance with the command read out of a command memory. The sequencer measures the time of the change from the code and the present time, and then adds the measured time to the corresponding command, and stores the time into the command memory.

11 Claims, 24 Drawing Sheets

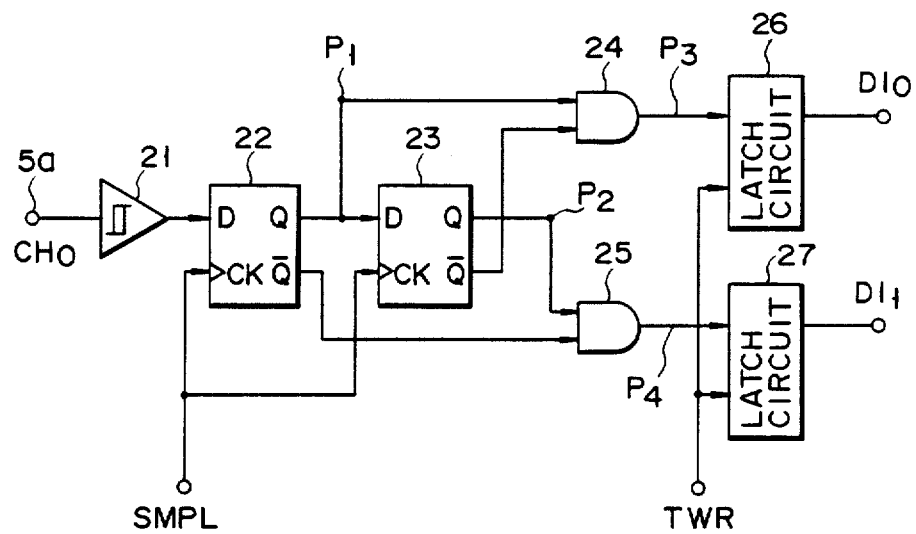
F I G. 5

F I G. 13A 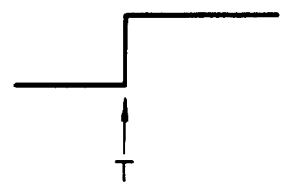
F I G. 13B 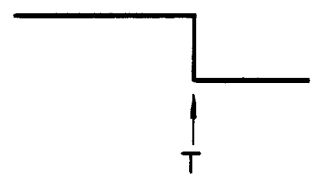
F I G. 13C 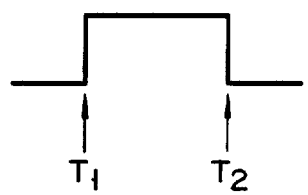
F I G. 13D 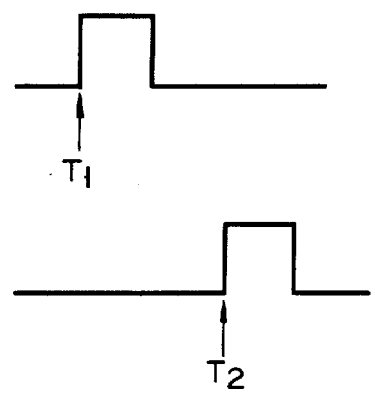

| ADDRESS OF COMMAND MEMORY | COMMAND | |
|---|---|---|
| 0 | WIDTH $CH_{0,0}$, SINGLE, $T_0$ | ① |
| 2 | $WIDTH_2$ $CH_{0,0}$, $T_1$, INTON | |
| 4 | WIDTH $CH_{1,1}$, SINGLE, $T_2$ | ② |
| 6 | $WIDTH_2$ $CH_{1,0}$, $T_3$, INTON | |
| 8 | WIDTH $CH_{2,0}$, SINGLE, $T_4$ | ③ |
| 10 | $WIDTH_2$ $CH_{3,0}$, $T_5$, INTON | |
| 12 | NOP | ④ |
| 14 | NOP | |
| 16 | NOP | |
| 18 | NOP | |
| 20 | NOP | |
| 22 | NOP | |
| 24 | NOP | |
| 26 | NOP | |
| 28 | NOP | |
| 30 | NOP | |

F I G. 14

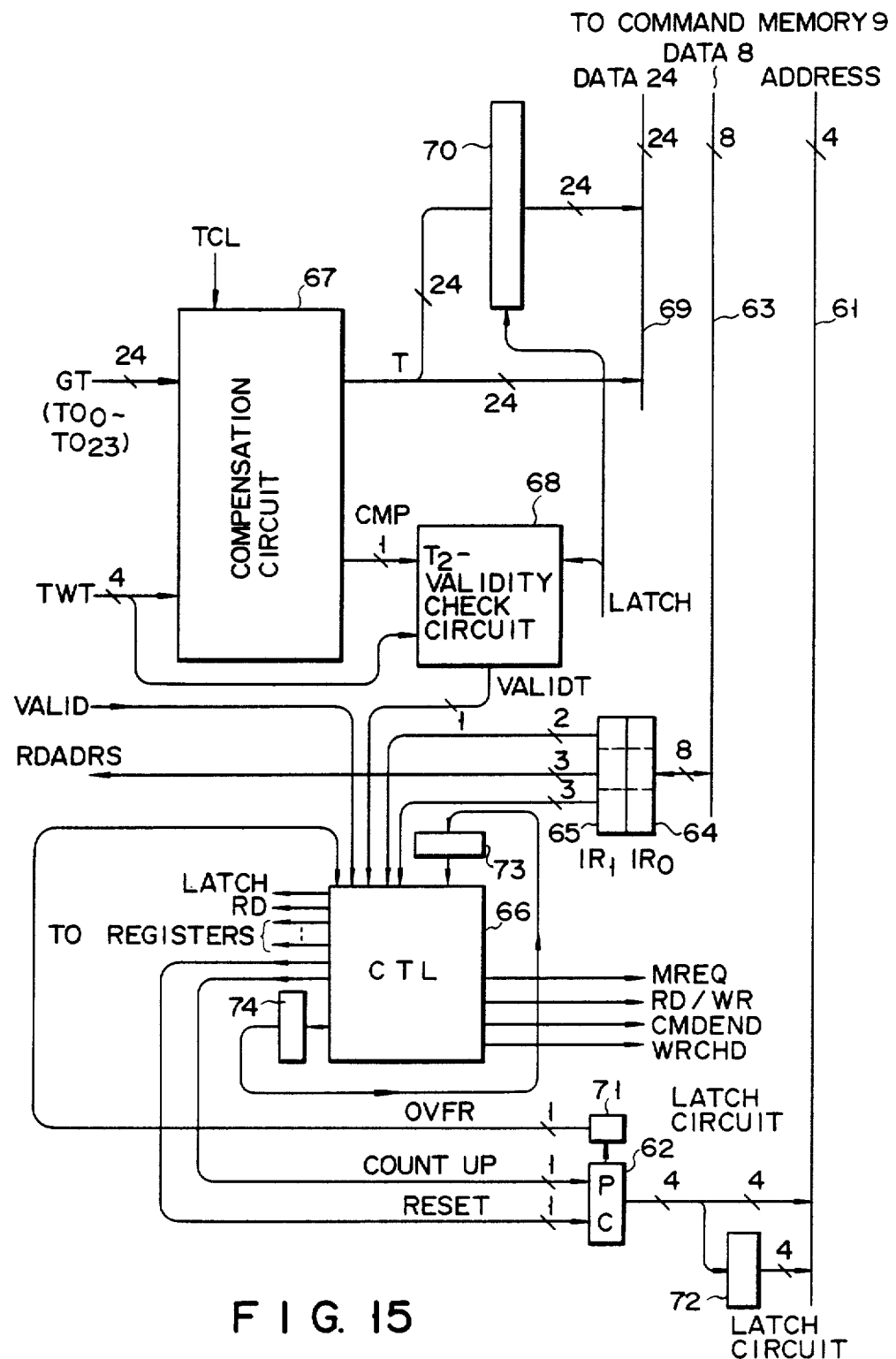
F I G. 15

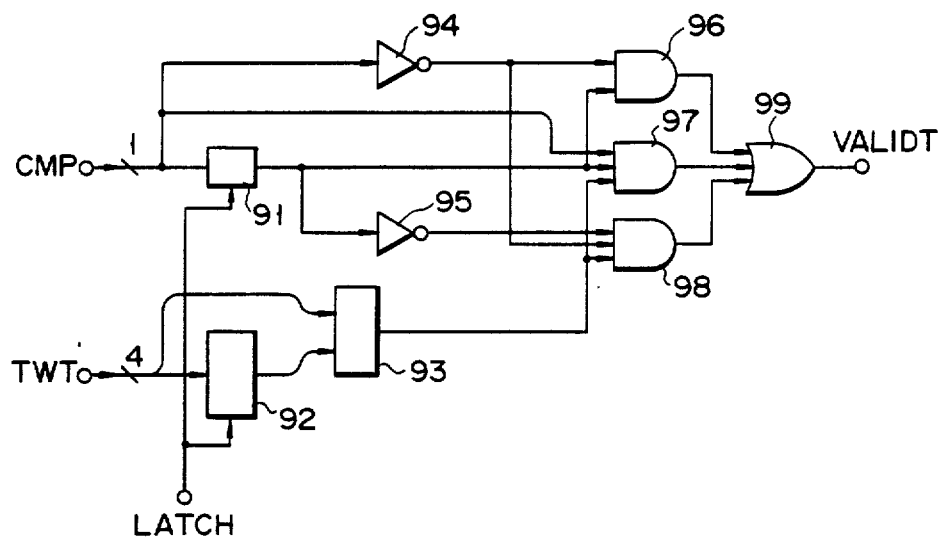
F I G. 19
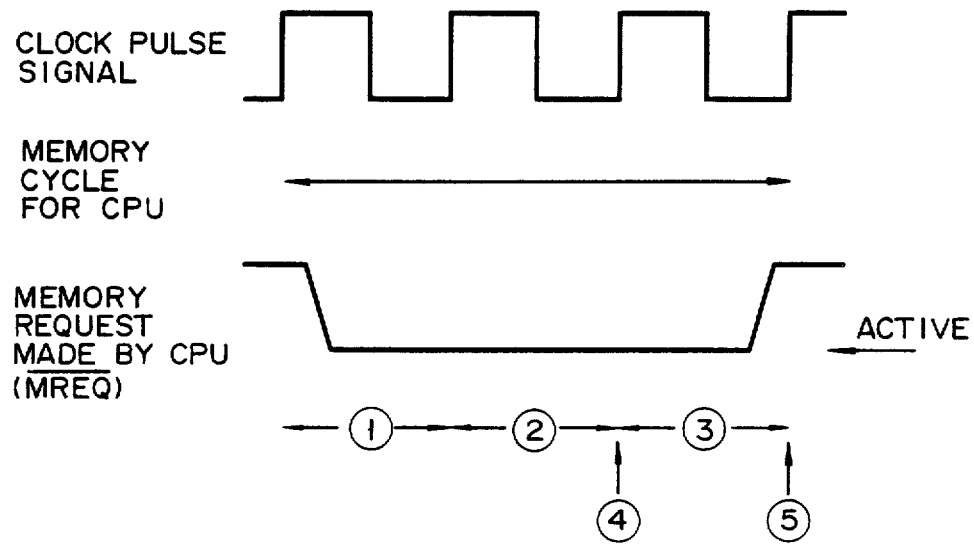
F I G. 21

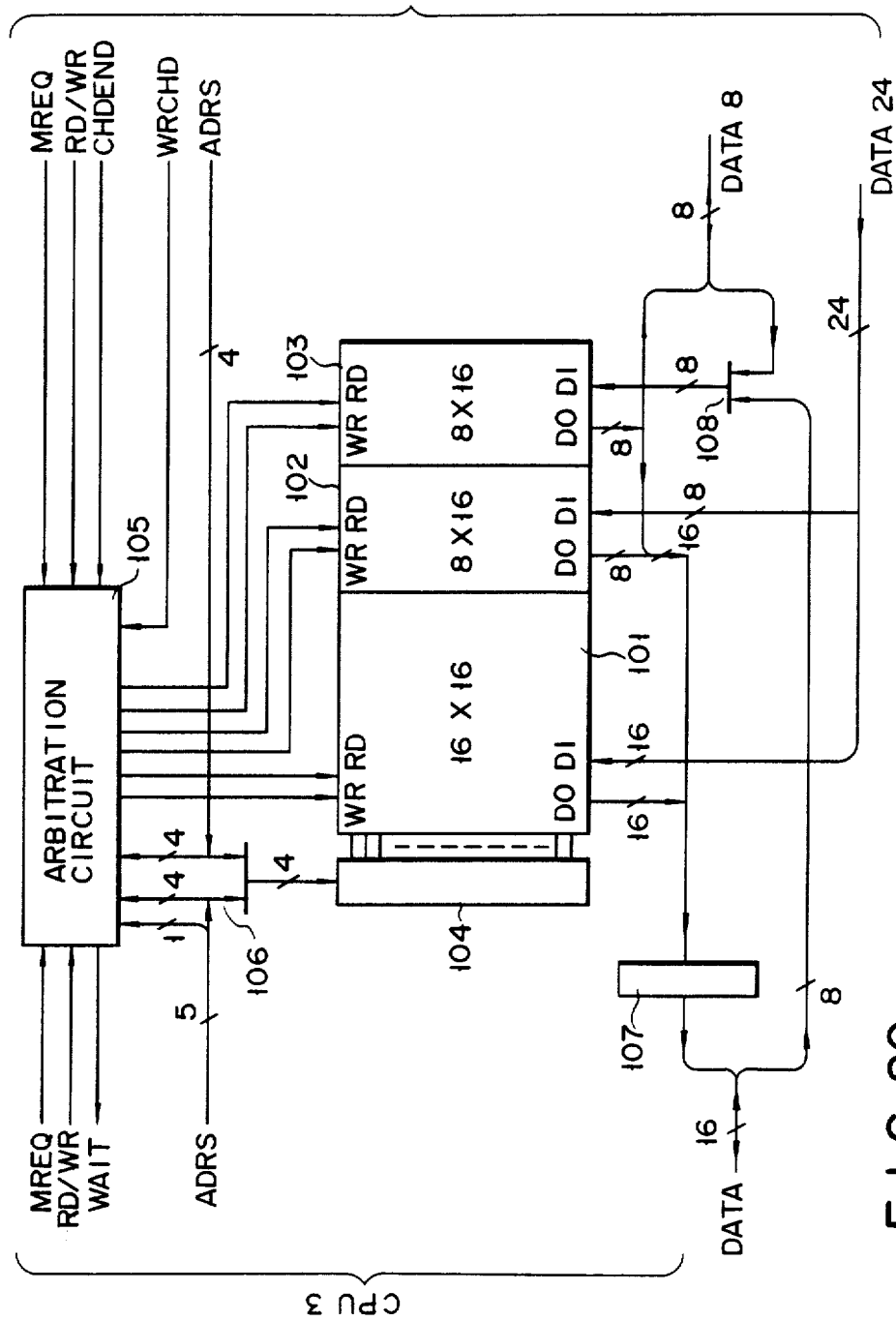
F I G. 20

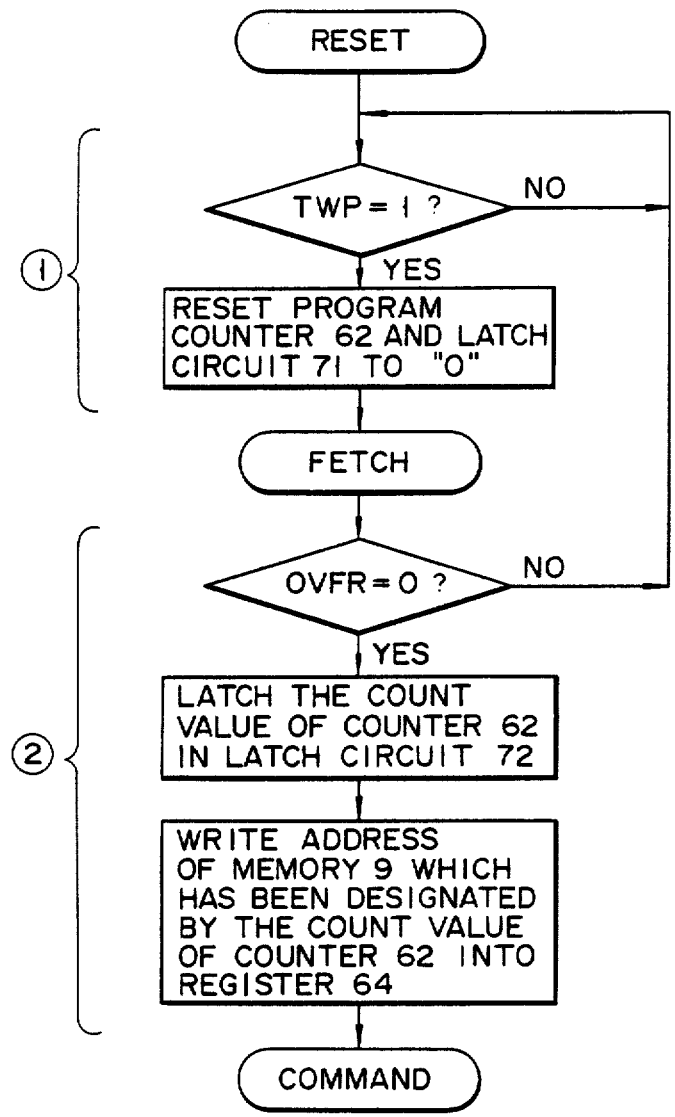
F I G. 22A

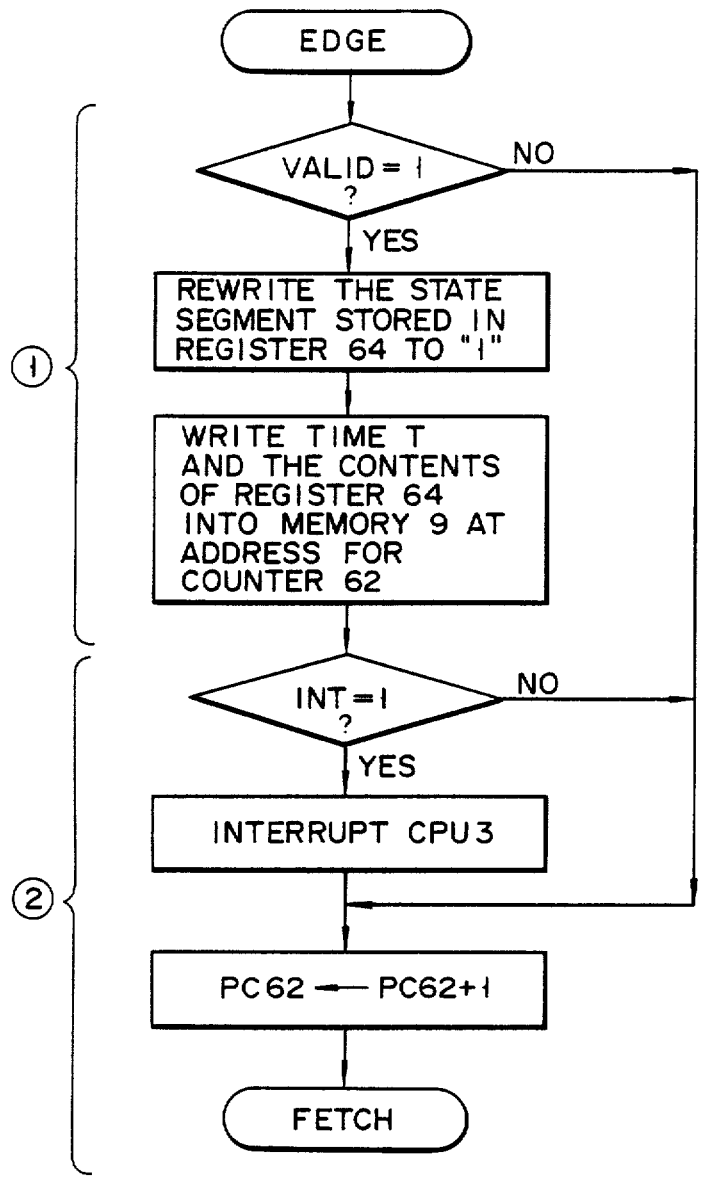
F I G. 22C

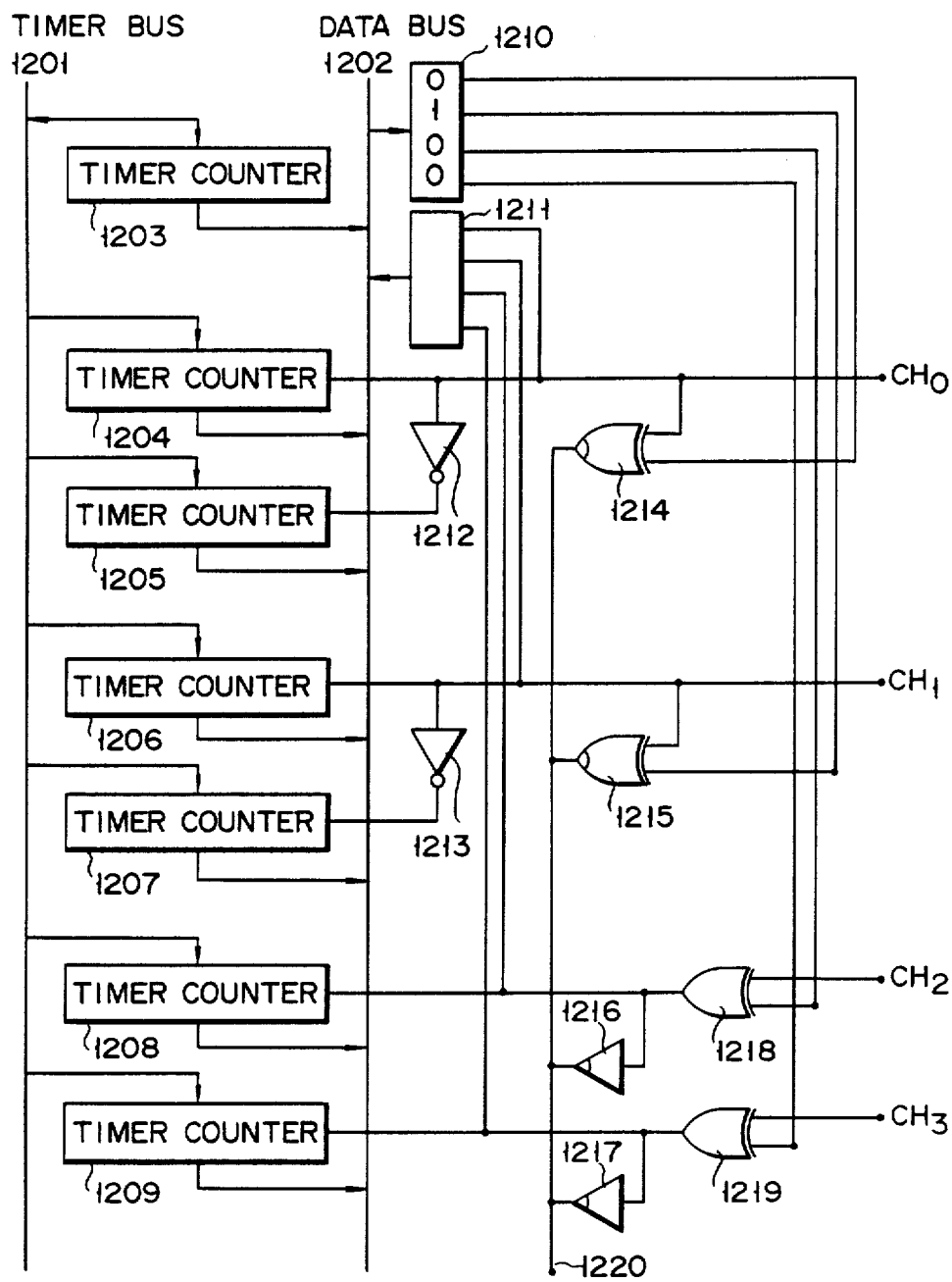
F I G. 23

PULSE INPUT APPARATUS

BACKGROUND OF THE INVENTION

1. Field of the Invention

The present invention relates to a pulse input apparatus for inputting to a central processing unit the time data representing the time at which an external signal has changed.

An automatic control system is used in, for example, an automobile, for controlling the various components of the automobile in accordance with the items of data representing the operation conditions of these components which vary with time. More specifically, the sensors provided in the automobile detect the operation conditions of the components and generate the signals representing these conditions. Hence, when the operation conditions of the components change, the signals output by the sensors also change. The items of time data, which represent the times at which the operation conditions change, are input to the central processing unit of the automatic control system. A pulse input apparatus is used to input such time data items to the central processing unit. Pulse input apparatuses are used in various control systems designed to control a variety of machines.

2. Description of the Related Art

Such a pulse input apparatus is disclosed in, for example, U.S. Pat. No. 4,222,103. As is shown in FIG. 23, this apparatus comprises timer counter 1203 and registers 1204 to 1209. Timer counter 1203 measures time and outputs data representing the present time. Registers 1204 to 1209 are used to store the items of data representing the times at which the signals input to the apparatus have changed. More precisely, each of these registers stores the time data which timer counter 1203 outputs the moment the register receives a trigger signal generated when the signal input to the apparatus changes. Each register can store such time data, without any interrupt of the computer program running for the automatic control of a machine. For instance, when data "0100", which represents that the input signal has changed, is stored into another register 1210, logic gates 1212 to 1219 perform logic operations on this data and the input signal, whereby trigger signals are supplied to registers 1204 to 1209 at the times when the input signal has its level changed, as is illustrated in FIG. 24. In response to the trigger signals, each of registers 1204 to 1209 stores and holds the count value of timer counter 1203. The data representing the number of the channel, in which the input signal has been transmitted, is stored in register 1211.

The operation of the pulse input apparatus will be explained in greater detail, with reference to the flow chart of FIG. 25. A sequence of operations is repeated for each channel, in response to an interrupt signal. The sequence consists of the analyzing of an interrupt factor, the reading of the time, the setting of the next interrupt factor, and the waiting for the next interrupt. More specifically, in operation sequence 1, the interrupt factors for all channels are set, such that all channels wait for an interrupt signal. In operation sequence 2, when an interrupt signal is generated, the interrupt factor is analyzed, and the time, at which the input signal transmitted in the first channel has changed, is read out from register 1206, and finally the next interrupt factor is set to "0". Then, the channel identified by the interrupt factor this set waits for an interrupt signal. Five other sequences of similar operations are performed, thereby the data items representing the times, at which the input signals transmitted in the other five channels have changed, are read out from registers 104, 105, 107, 108, and 109. To perform these similar sequences of operations, the central processing unit must repeatedly wait for an interrupt signal and set a next interrupt factor. The pulse input apparatus disclosed in U.S. Pat. No. 4,222,103 can record only one data item representing the time at which the input signal transmitted in each channel has changed. Therefore, when the input signal has a complex waveform, the central processing unit is interrupted frequently. As a consequence, the load on the central processing unit increases, and the ability of the control system as a whole decreases.

Another type of a pulse input apparatus is disclosed in U.S. Pat. No. 4,259,719 and U.S. Pat. No. 4,283,761. This pulse input apparatus has an FIFO (First-In, First-Out) stack. A trigger signal is generated when it is detected that the input signal changes. In response to the trigger signal, both the data representing the present time and the data representing the change in the operation condition of a device. The data items representative of the changes of the operation condition are stored in the FIFO stack in the order in which the condition changes have occurred. Assuming that the first data representing a phase difference and the second data representing the pulse width related to the phase difference, are stored in the FIFO stack, then it is necessary to read all data items from the FIFO stack to search for the second data in accordance with the first data. Further, it is necessary to execute an analysis routine for reading all data items from the FIFO stack and then classifying the data items thus read out from the FIFO stack. Hence, the central processing unit, to which the pulse input apparatus inputs the time data items, must perform all operations required for determining the time of any change in the operation condition, based on the data items stored into the FIFO stack.

As has been pointed out, when the conventional pulse input apparatus is used to input time data items to a central processing unit so that this unit determine the complex-wave-form of a signal representing the changes in the operation condition of a device, the central processing unit must be interrupted frequently, or must execute an analysis routine. Obviously, the work load on the central processing unit is great, and the ability of the automatic control system employing the central processing unit is inevitably limited.

SUMMARY OF THE INVENTION

It is accordingly the object of the present invention to provide a pulse input apparatus which can determine the changes of external signals without imposing a heavy work load on a central processing unit even if complex measuring conditions are set for external signals.

According to the invention, there is provided a pulse input apparatus comprising a timer counter, an input circuit, an input memory, a command memory, and a sequencer. The timer counter counts predetermined clock pulses and generates reference time data. The input circuit samples an input signal of each channel in synchronism with clock pulses corresponding to the reference time data. The input memory stores the components of the signal, which have been sampled by the input circuit, in synchronism with the clock pulses corresponding to the reference time data, at the addresses of the input memory which are designated by the reference time data. The input memory also converts all of the sampled components of the signal of each channel, which have been stored, into a code which present the time at which the input signal has changed. The command memory stores commands for recording the data items representing the kind of the change in the input signal, and also the data item representing the time at which the change has occurred. The sequencer receives the commands sequentially read from the command memory, such that all commands are executed before data items are stored at all addresses of the input memory. Whenever a command for recording the time of a predetermined change in the input signal is supplied to the sequencer, the sequencer reads the code from the input memory, which represent the time of the change of the input signal, and receives the count value of the timer counter, which represents the present time. The sequencer determines the time of the condition change of the designated channel, based on the code and the present time, and then adds the data representing the time thus determined, to the command for recording the time.

The components of an input signal corresponding to a certain channel, which have been sampled by the input circuit, are sequentially written into the input memory in synchronism with the pulses of the reference clock signal generated by the timer counter. The code, which represents the time of the change of the input signal, is read out from the input memory. The reading of the code from the input memory is carried out independently of the writing of the sampled signal components therein. Therefore, a plurality of measuring conditions can be set for any channel. Moreover, the sampled components of a signal which have been stored into the input memory are converted into the code representing the time at which the input signal has changed. Thus, the time of the change can be read out from the input memory by accessing the input memory only one time.

As has been described, the sequencer reads from the command memory the command for recording the kind and time of a specific change in the input signal so as to complete the execution of this command, before sampled input signal components are stored at all addresses of the input memory. Thus, the sequencer compensates the time of the specific change of the input signal in a certain channel, based on the present time represented by the count value of the timer counter, and adds the data showing the compensated time to the corresponding command read out from the command memory before sampled input signal components are written at all addresses of the input memory.

Since the components of a signal of any specified channel are sequentially stored in the input memory, and the sequencer determines the time of any specified change of the input signal in the channel corresponding to a command read out from the command memory, and then adds the data representing the determined time to the corresponding command, and causes the command with the time data to store in the command memory, the central processing unit need not be interrupted frequently, even if a signal having a complex waveform is generated from a sensor. In addition, since the code representing the time of the change of the input signal can be read from the input memory by accessing the input memory only one time, and the sequencer determines the time of the change, the central processing unit need not execute a special subroutine, such as an analysis routine for selecting necessary data items.

BRIEF DESCRIPTION OF THE DRAWINGS

FIG. 5 is a circuit diagram showing one of the identical differentiators incorporated in the input circuit shown in FIG. 4;

FIGS. 13A-13D are diagrams for explaining functions of commands;

FIG. 14 is a table showing various commands, and the addresses of the command memory storing these commands;

FIG. 15 is a block circuit diagram of the sequencer used in the pulse input apparatus shown in FIG. 1;

FIG. 19 is a block circuit illustrating the T2-validity check circuit;

FIG. 20 is a block diagram of the command memory;

FIG. 21 is a timing chart showing the signals input to the command memory;

FIGS. 22A to 22F are flow charts explaining the operation of the sequencer; and

FIG. 23 to 25 are diagrams explaining a conventional pulse input apparatus.

DETAILED DESCRIPTION OF THE PREFERRED EMBODIMENTS

Figure 1:
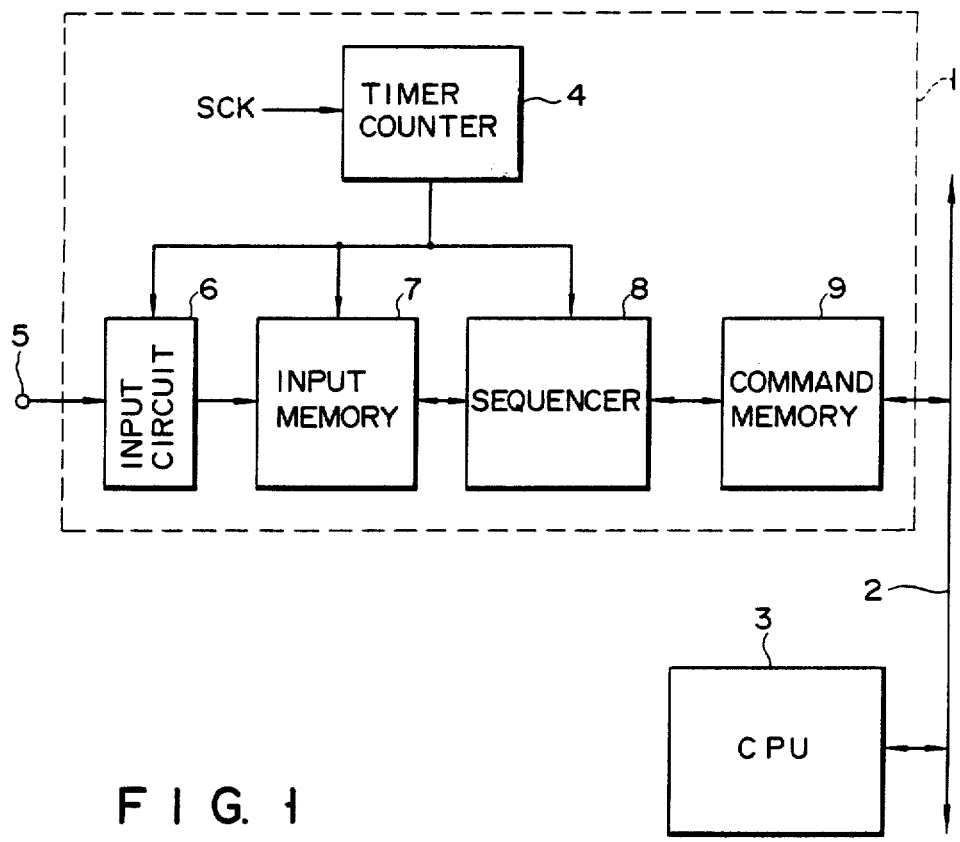
FIG. 1 is a block diagram showing a pulse input apparatus according to the present invention.

FIG. 1 is a block diagram showing pulse input apparatus 1 according to the present invention. As is shown in this figure, pulse input apparatus 1 is connected by bus 2 to central processing unit (CPU)3.

Pulse input apparatus 1 comprises timer counter 4, input circuit 6, input memory 7, sequencer 8, and command memory 9. Timer counter 4 generates a reference clock signal, and its output terminal is connected to the clock input terminals of input circuit 6, input memory 7, and sequencer 8. Sequencer 8 is connected to command memory 9.

Input circuit 6 samples the leading edge and trailing edge of the signal input to input terminal 5, in synchronism with the pulses of the reference clock signal output by timer counter 4. Input memory 7 stores the sampled components of the input signal, which have been sampled by circuit 6, in synchronism with the pulses of the reference clock signal supplied from timer counter 4. Sequencer 8 reads, from input memory 7, the code representing the time at which an input signal has changed, according to the command specified by CPU 3 and read out of command memory 9, and then adds this code to the command specified by CPU 3 and causes it to store in command memory 9.

Figure 2:
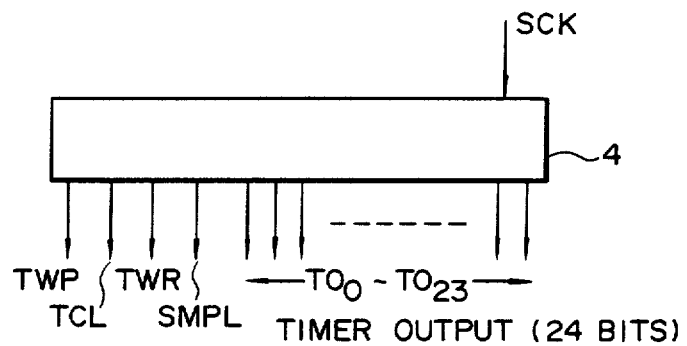
FIG. 2 is a block diagram showing the timer counter incorporated in the pulse input apparatus shown in FIG. 1.
Figure 3:
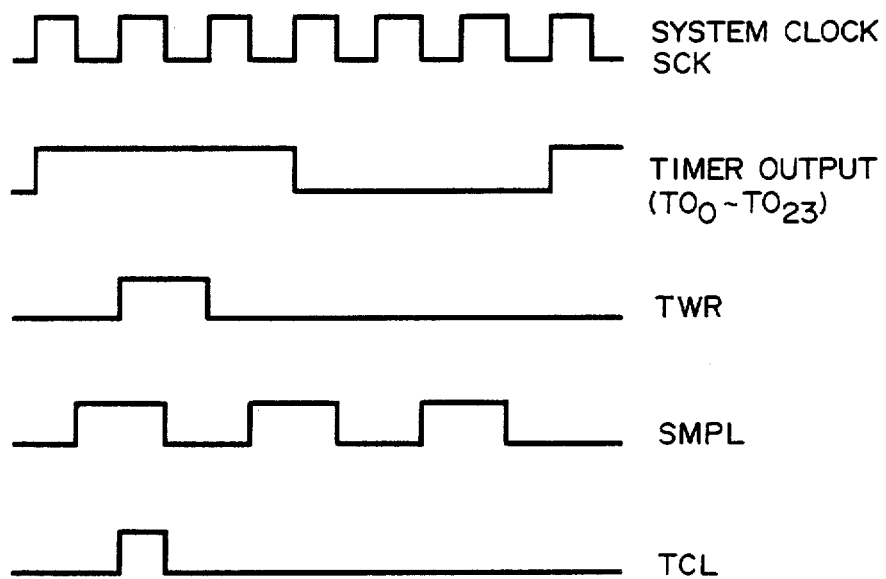
FIG. 3 is a timing chart showing the signals input to and output by the timer counter.

Timer counter 4 is counted up by pulses which have been obtained by dividing the frequency of a system clock signal SCK by the factor of six, and generates a 24-bit ($TO_0$ to $TO_{23}$) timer output, that is, reference time data (the present time) and also control pulses TWP, TCL, TWR, and SMPL, as is illustrated in FIGS. 2 and 3. Pulse TWP is generated every time the timer output ($TO_0$–$TO_{23}$) is renewed 16 times, and is at a high level during a time interval corresponding to the one-clock cycle of the system clock signal SCK. Pulse TCL is a signal for determining a timing for latching the timer signal ($TO_0$–$TO_{23}$) within sequencer 8. Pulse TWR is a write pulse for input memory 7. Pulse SMPL is a sampling pulse for input circuit 6.

Figure 4:
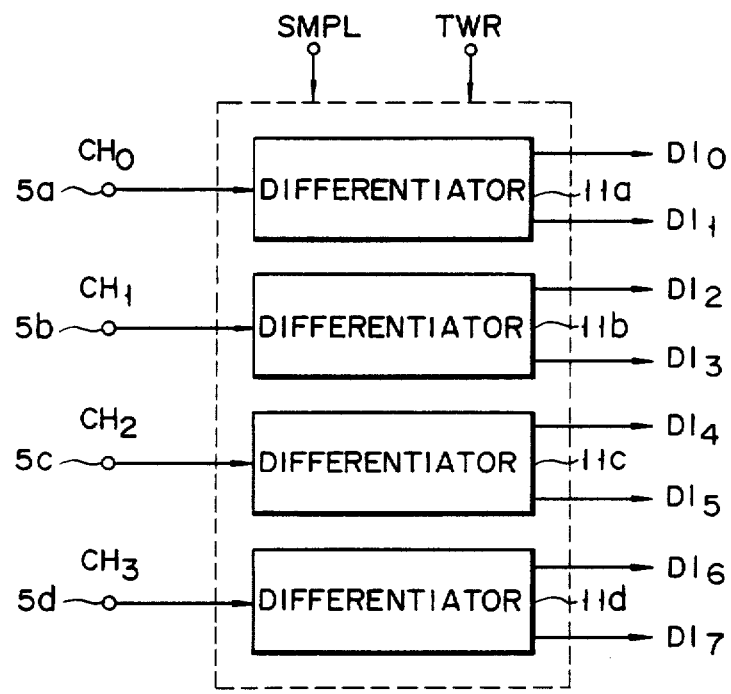
FIG. 4 is a block diagram showing the input circuit used in the apparatus shown in FIG. 1.

As is shown in FIG. 4, input circuit 6 has four input channels $CH_0$ to $CH_3$. Four differential circuits 11a to 11d are used for channels $CH_0$ to $CH_3$, respectively. These differential circuits have the same structure. The differential circuit for channel $CH_0$, for example, will be explained with reference to FIG. 5. As is shown in FIG. 5, the input signal supplied to input terminal 5a is converted into a stable binary signal by means of input buffer 21 having a hysteresis characteristic. The binary signal is input to D flip-flops 22 and 23. Either D flip-flop holds the binary signal in response to the pulse SMPL input to its clock input to its clock input terminal CK, and outputs two signals Q and $\overline{Q}$ from its Q and $\overline{Q}$ terminals. Signal Q output by flip-flop 22 and signal $\overline{Q}$ output by flip-flop 23, which have a phase difference of the one-clock cycle of the pulse SMPL, are gated by AND gate 24. Similarly, signal $\overline{Q}$ output by flip-flop 22 and signal Q output by flip-flop 23, which have a phase difference of the one-clock cycle of the pulse SMPL, are gated by AND gate 25. Hence, AND gate 24 outputs a differential pulse representing the leading edge (rising edge) of the input signal, whereas AND gate 25 outputs a differential pulse showing the trailing edge (falling edge) of the input signal. These differential pulses are latched by output-latch circuits 26 and 27, respectively. In response to the TWR write pulse, output-latch circuits 26 and 27 supply the differential pulses to input memory 7. The differential pulses are written into input memory 7, as data items DI0 and DI1. Both latch circuit 26 and 27 are cleared at the trailing edge of the TWR pulse.

Figure 6:
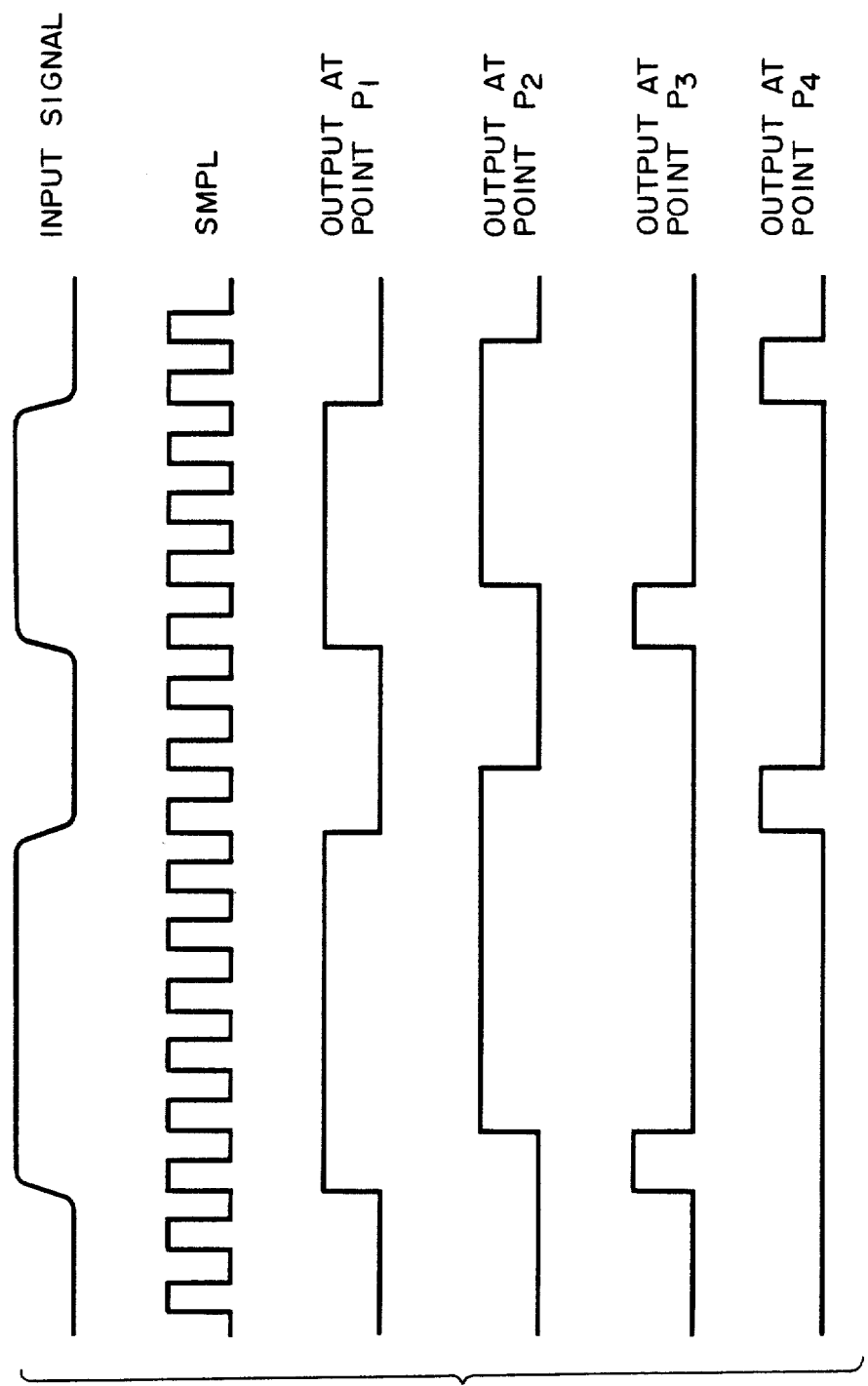
FIGS. 6 and 7 are timing charts showing the signals input to and output by various components of the differentiator illustrated in FIG. 5.
Figure 7:
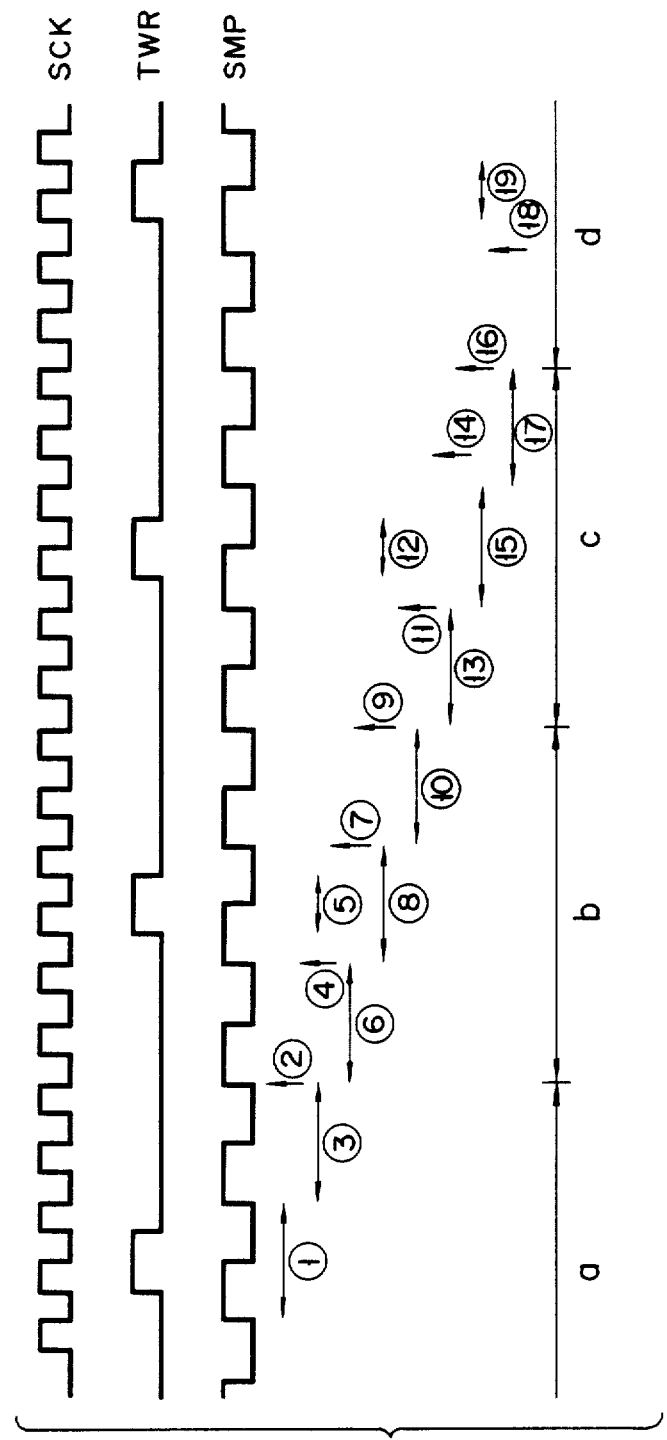

FIG. 6 is a timing chart shows the waveforms of the signals generated within differential circuit 11a shown in FIG. 5, and also the waveforms of the input signal and sampling pulse SMPL. As is shown in this timing chart, the leading edge and trailing edge of the input signal lags behind the sampling pulse SMPL the one-clock cycle at the most. To eliminate the influence of this time lag, the one-clock cycle of the sampling pulse SMPL is one-third of the one-clock cycle of the write pulse TWR, as is shown in FIG. 7. Hence, the pulse representative of the change which has occurred during period ⑥ is latched at time ⑦; the pulse showing the change which has taken place during period ⑧ is latched at time ⑨; and the pulse representing the change which has taken place during period ⑩ is latched at time ⑪. The pulses, thus latched, are written into input memory 7 during period ⑫. Thus, as can be understood from FIG. 7, the pulse showing any change which has occurred during period b is written into memory 7 during period ⑫, pulse showing any change which has happened during period c is written into memory 7 during period ⑲.

Figure 8:
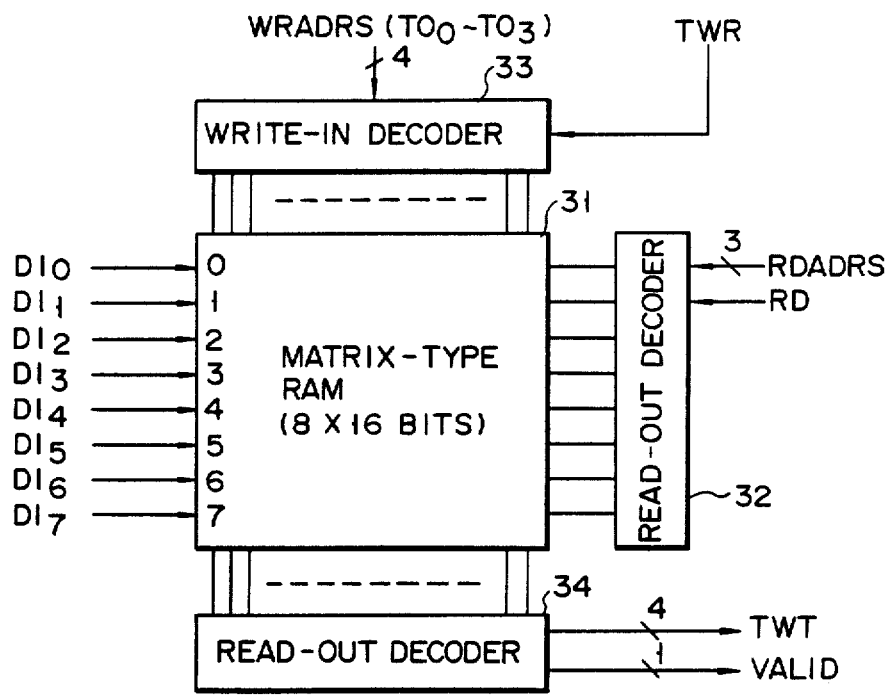
FIG. 8 is a block diagram showing the input memory incorporated in the apparatus shown in FIG. 1.
Figure 9:
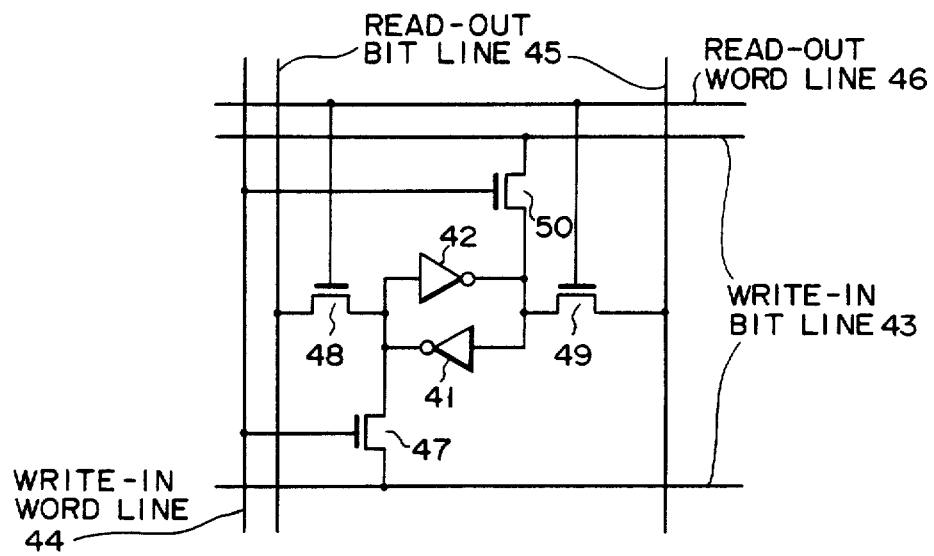
FIG. 9 is a circuit diagram of the input memory shown in FIG. 8.

As is illustrated in FIG. 8, input memory 7 comprises orthogonal RAM 31, read-out decoder 32, write-in decoder 33, and read-out encoder 34. Orthogonal RAM 31 has a memory capacity of $8 \times 16$ bits. In other words, it can store 16 words, each being 8-bit parallel data. Orthogonal RAM 31 has memory cells, one of which is shown in FIG. 9. As is shown in this figure, each memory cell is comprised of a 1-bit memory element and transistors 47 to 50. Memory element includes two inverters 41 and 42, and is connected to write-in bit line 43 by transistor 47, to write-in word line 44 by transistor 48, to read-out bit line 45 by transistor 49, and to read-out word line 46 by transistor 50. Write-in bit lines 43 intersect with read-out bit lines 45 at right angles, and write-in word lines 44 intersect with read-out word lines 46 at right angles. In other word, the write-in direction of RAM 31 is orthogonal to the read-out direction thereof.

Figures 10, 11:
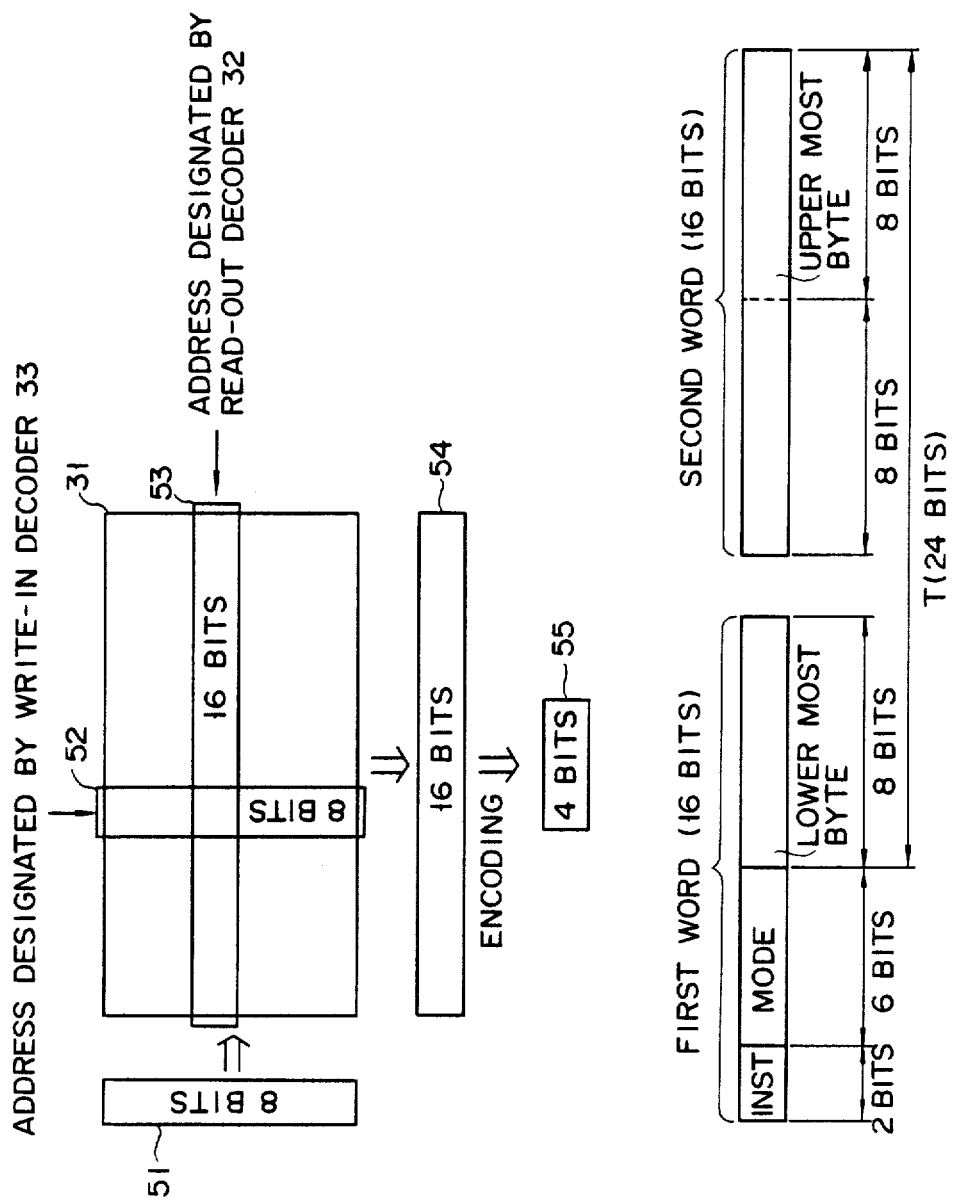
FIG. 10 is a diagram explaining the operation of the input memory.
FIGS. 11 to 12 show the formats of various commands.
Figure 12:
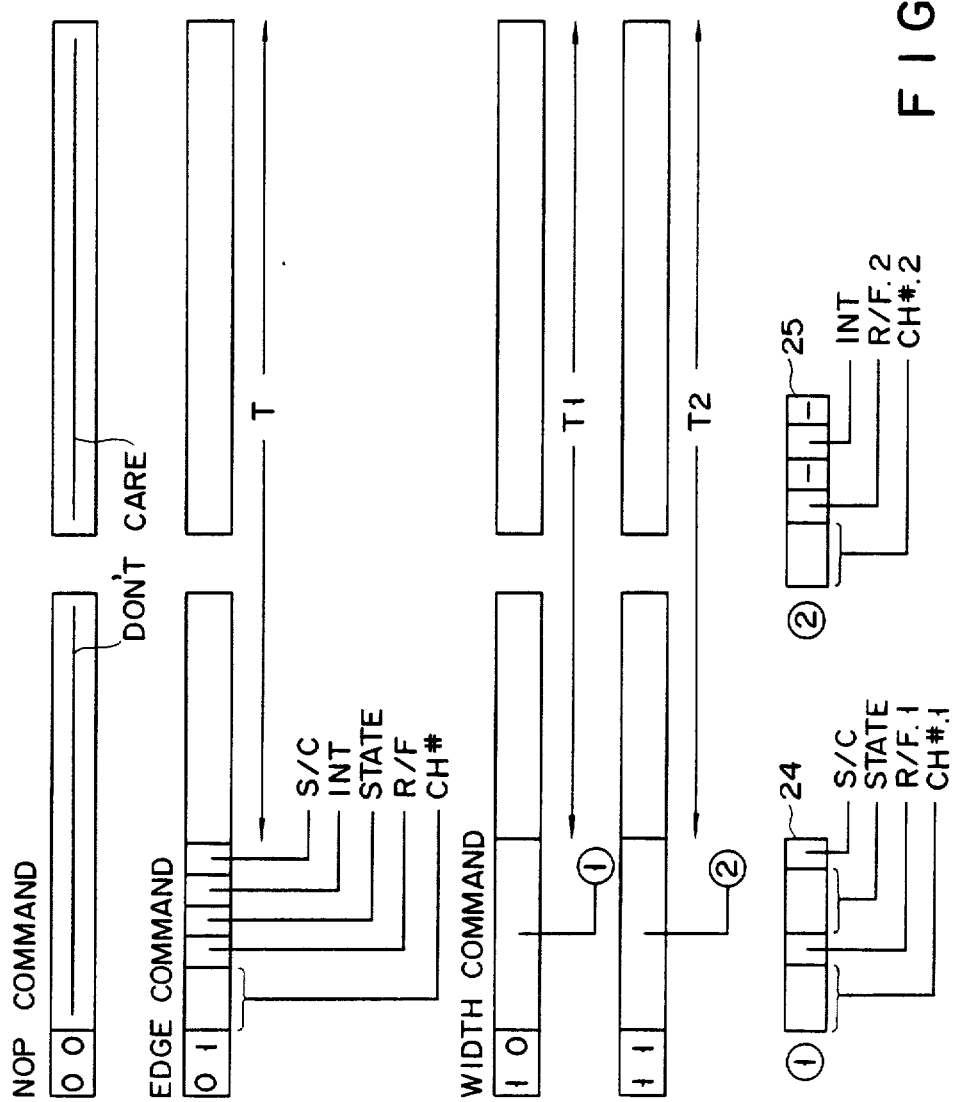

It will now be explained how data is written into, and read from, orthogonal RAM 31, with reference to FIG. 8 and FIG. 10. The 8-bit parallel data 51 (4 channels $\times$ 2 bit) output from input circuit 6 is written in RAM 31 in synchronism with pulse TWR output from timer counter 4, as shown by numeral 52 when a write-in address WRADRS represented by lower four bits ($TO_0$–$TO_3$) is selected by write-in decoder 33. When the input signal for each channel is stored in RAM 31, the leading edge portion and trailing edge portion are separately stored in RAM 31. Therefore, when the stored input signal will be processed later, the step for separating the input signal into two components is not necessary. Accordingly, input apparatus 1 can measure a plurality of conditions in a single channel by a plurality of commands, without a specific circuit.

To read data from orthogonal RAM 31, read-out decoder 32 decodes the 3-bit read-out address RADRS input from sequencer 8 into input memory 7. The data stored at this address is read out from RAM 31 in response to read signal RD input to decoder 32 from sequencer 8. As understood from the above write-in and read-out operations, the direction in which data is written in RAM 31 is orthogonal to that in which the data stored in RAM 31 is readout from RAM 31.

Data 54 output from RAM 31 is a time-series data consisting of 16 bits corresponding to 16 sampled components of one input data DIn (n=0 to 7). If this 16-bit time-series data includes a data item, representing the moment the input signal has changed, the data item indicates a binary "1". This data is encoded into 4-bit data TWT 55 and VALID signal by means of read-out encoder 34. When the 16-bit data 53 is read out of orthogonal memory 31, it is encoded into the 4-bit data 55. That is, the 4-bit TWT data is a code which is obtained by coding the 16-bit data including at least one data item "1" and represents the time at which the input signal has changed. When 16-bit data includes at least one bit representing "1", read-out encoder 34 outputs a VALID signal of logic "1". When the 16-bit data consists of "0" bits only, it represents that the input signal has not changed while the input signal are being sampled 16 times. If this is the case, read-out encoder 34 outputs a VALID signal of logic "0".

Input memory 7 has a memory capacity of 16bits, in the direction of time axis (row direction shown in FIG. 10) of which the sampled signal components of the input signal are sequentially written into it. Input memory 7 can, therefore, store data representing the changes which happen while the timer output ($TO_0$ to $TO_{23}$) is being renewed 16 times. Hence, if all commands stored in command memory 9 are executed while the timer output is being renewed 16 times, pulse input apparatus can execute all these commands correctly, thereby to determine the time at which the input signal has changed.

The commands which sequencer 8 executes will be described. Command memory 9 stores three kinds of commands, i.e., NOP command, EDGE command, and WIDTH command. The NOP command is a single command formed of one unit. The EDGE command is also a single command made of one unit. The WIDTH command is a double command consisting of two units. The command unit consists of two words, each formed of two bytes. Hence, the command unit is comprised of 32 bits. As is shown in FIG. 11, the unit consists of a 2-bit INST section, a 6-bit MODE section, and a 24-bit T section. The INST section identifies the type of the command. If the INST section is "00", it represents a NOP command. If it is "01", it represents an EDGE command. If it is "10" or "11", then it represents a WIDTH command. The MODE section is used for designating conditions for measuring the time, for example, for designating the leading edge or trailing edge of the input signal. The T section is used for writing the time, at which the input signal has changed, by means of sequencer 8. That is, since the T section is written-in by sequencer 8, CPU 3 need not write data inputting the T section of the command. Whatever data has been written into the T section before the command is executed, sequencer 8 neglects the data.

The functions which the NOP command, the EDGE command, and the WIDTH command perform will be explained.

(a) NOP Command

The NOP command instructs sequencer 8 not to process the data stored in the MODE section or in the T section. The NOP command is used, merely to fill in the vacant location of command memory 9.

(b) EDGE Command

This is a command to determine the time T at which the input signal of a desired channel rises or falls as is shown in FIG. 13A. The MODE section of the EDGE command consists of a 2-bit channel-number subsection, a 1-bit R/F subsection, a 1-bit STATE subsection, a 1-bit INT subsection, and a 1-bit S/C subsection. The channel-number (CH#) subsection is a data area for designating the channel correspondent to the input signal including changes to be detected. The R/F subsection has the logic value of "1" when the leading edge of the input signal must be detected, and the logic value of "0" when the trailing edge of the input signal must be detected. The STATE subsection has the logic value of "0" when the time of any change of the input signal has yet to be measured, and the logic value of "1" when this time has already been measured. The INT subsection stores a flag representing whether or not CPU 3 must be interrupted after the time of change of input signal has been measured. The S/C subsection stores a flat which has the logic value of "1" when the times of the changes of the input signal must be continuously measured, and the logic value of "0" when the time of only one change of the input signal must be measured. The STATE subsection can be rewritten by sequencer 8 after the time of the change of the input signal has been measured. The other three subsection of the MODE section cannot be rewritten; they remain unchanged once they have been set by CPU 3.

(c) WIDTH Command

This command instructs sequencer 8 to determine time T1 of the first change of the input signal, and also time T2 of the second change of the input signal, so as to measure the pule width as is shown in FIG. 13B, to measure the pulse cycle as is illustrated in FIG. 13C, and to measure the phase difference between two signals input via two channels. The EDGE command consists of two sub-commands. The first sub-command is used to measure time T1, and the second sub-command is used to measure time T2. The MODE section of the first sub-command is comprised of a 2-bit CH#.1 subsection, a 1-bit R/E1 subsection, a 2-bit STATE subsection, a 1-bit S/F subsection, and a 1-bit S/C subsection, as shown in a mark ①. The MODE section of the second sub-command is comprised of a 2-bit CH#.1 subsection, a 1-bit R/F.2 subsection, and a 1-bit INT subsection, as shown in a mark ②. The CH#.1 subsection is a data area for designating channel in which first time T1 is measured. The R/F.1 subsection has the logic value of "1" when the leading edge (rising edge) of the input signal must be detected, and the logic value of "0" when the trailing edge (falling edge) of the signal must be detected. The CH#.2 segment designates the channel in which second time T2 is measured. The R/F.2 subsection has the logic value of "1" when the leading edge of the input signal must be detected, and the logic value of "0" when the trailing edge of the input signal must be detected. The S/C subsection, and the INT subsection are identical, in function, to those of the EDGE command. More specifically, the STATE subsection stores data "00" before the time of change is measured, data "01" when sequencer 8 has completed the first sub-command, and data "10" when sequencer 8 has completed the second sub-command. Time T1 and time T2, both determined by sequencer 8, will be written in the T section of the first sub-command and the T section of the second sub-command, respectively.

Figure 24:
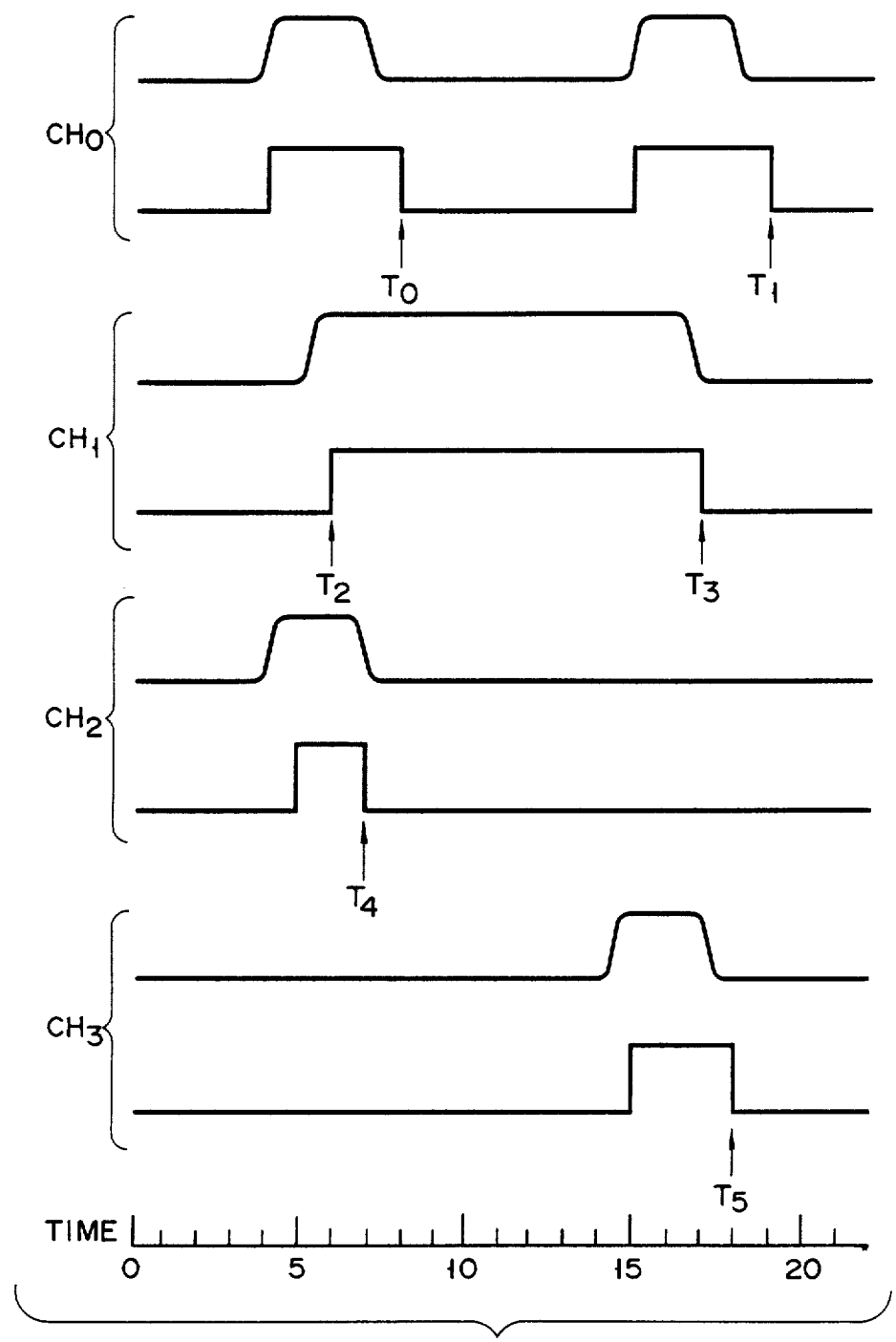
Figure 25:
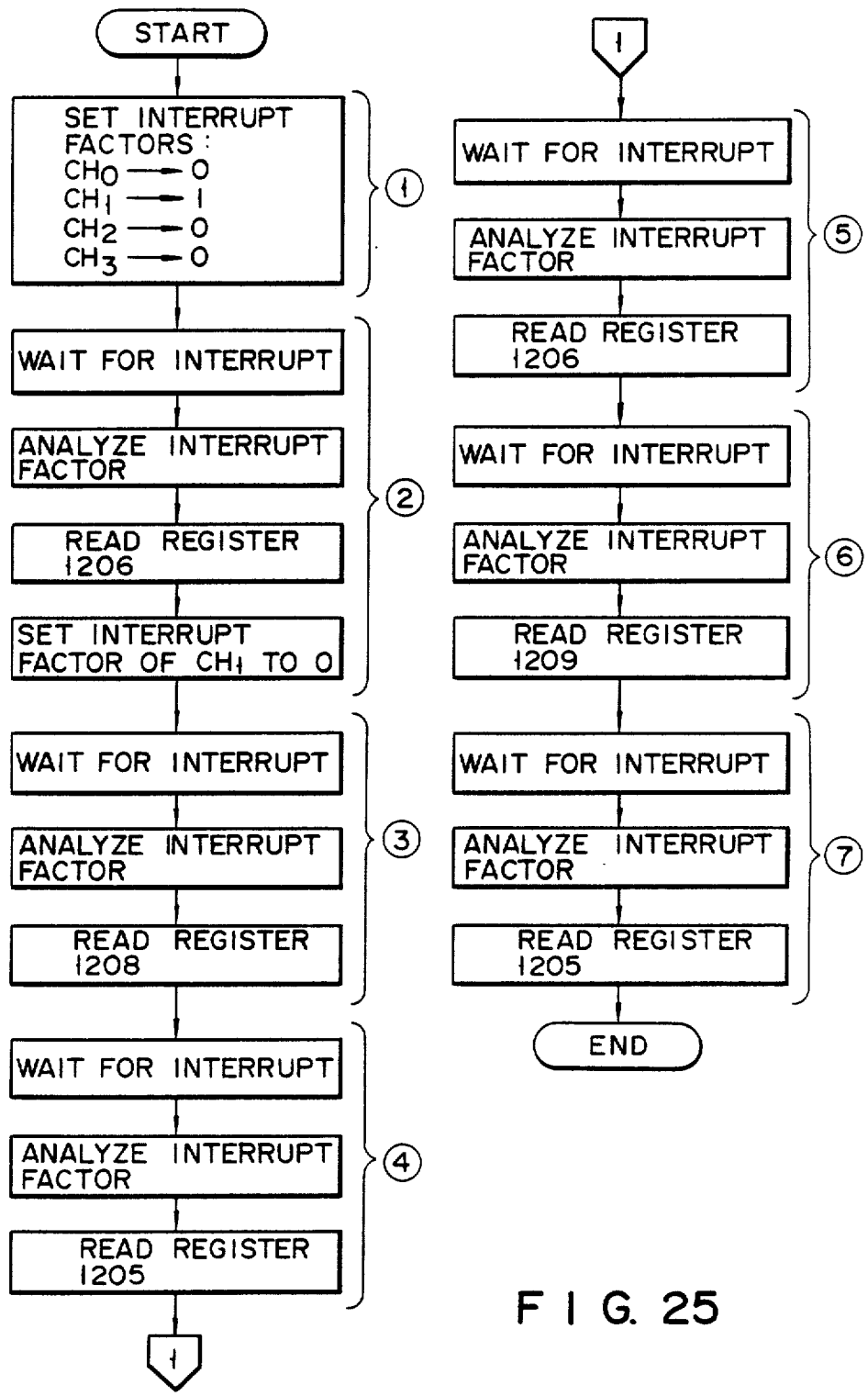

FIG. 14 is a table showing the commands written in command memory 9, which will be used to measure the changes of the various waveforms shown in FIG. 24. It suffices to use three WIDTH commands to determine the cycle of a pulse signal, the pulse width of a pulse signal, and the phase difference between two pulse signals, as is shown in FIG. 24. Hence, six sub-commands suffice to determine the times of the wave-forms in FIG. 24. If CPU 3 stores these six subcommands in command memory 9, CPU 3 is released from the task for measuring the change. Since command memory 9 can store 16 commands at most, the six sub-commands are stored at 0th to 11th addresses (①-③) of command memory 9, and NOP commands are stored at the remaining addresses, i.e., 12th to 32th addresses ④.

In FIG. 14, mark ① denotes a WIDTH command for measuring the cycle of the input pulse signal of channel CH0, by detecting time T0 at the trailing edge of a pulse and time T1 at the trailing edge of the next pulse. After both time T0 and time T1 have been detected, pulse input apparatus 1 interrupts CPT 3. The command designates only one measurement of the pulse cycle.

Mark ②  designates a WIDTH command for determine the pulse width of the input signal of channel CH1, by measuring time T2 at the leading edge of the input signal and time T3 at the trailing edge of the signal. CPU 3 is interrupted after time T2 and T3 have been detected.

Mark ③ indicates a WIDTH command for determining the phase difference between the input signal of channel CH2 and the input signal of channel CH3, by detecting time T4 at the trailing edge of the signal of channel CH2 and the time T5 at the trailing edge of the signal of channel CH3. CPU 3 is also interrupted after time T4 and T5 have been detected.

Sequencer 8 will now be described, with reference to FIG. 15. Sequencer 8 scans command memory 9 for sequentially reading out the commands stored therein. In accordance with each command, sequencer 8 reads data from input memory 7. Sequencer 8 then determines, from the data, the time of the change in the input signal, and writes the data representing the time into command memory 9. The writing of data into input memory 7 and the reading of data from command memory 9 are carried out independently. By combining two or more commands stored in command memory 9, the data stored in input memory 7, which corresponds to one channel or one input terminal, can be used for time-measuring a plurality of times.

As is shown in FIG. 15, sequencer 8 comprises program counter 62, two 8-bit registers (IR0) 64 and (IR1) 65, controller (CTL) 66, compensation circuit 67, T2-validity check circuit 68, and 24-bit register 70. Program counter 62 is connected by 4-bit address bus 61 to command memory 9, and 8-bit registers (IR0) 64 and (IR1) 65 are connected by 8-bit bus 63 to command memory 9. Program counter 62 generates a read-out address to be supplied to command memory 9. The 8-bit registers 64 and 65 store the INST section and MODE section of a command, respectively. Controller 66 controls each component of pulse input apparatus 1, in accordance with the commands stored in registers 64 and 65. Compensation circuit 67 receives the time data read from input memory 7 and showing time of the change of the input signal, and compensates this time based on the present time. T2-validity check circuit 68 determines, in response to the WIDTH command, whether the data representing time T2 is valid or not valid. The 24-bit register 70 temporarily stores the compensated time data, so that the compensated time data is written into the T section of command memory 9 via 24-bit data bus 69.

Program counter 62 comprises a 4-bit counter. Its count value is incremented by one every time an count-up signal COUNTUP is input to counter 62 from controller 66. Counter 62 is reset by a reset signal RESET. Carry from the MSB (Most Significant Bit) of program counter 62 is held by 1-bit latch circuit 71. Upon receipt of the carry, latch circuit 71 output an overflow signal OVER, which indicates that counter 62 has overflown, to controller 66. Hence, controller 66 counts up counter 62 from when program counter 62 is reset until counter 62 overflows. Command memory 9 is scanned in accordance with the addresses sequentially output from counter 62. The 4-bit output of counter 62 is held by 4-bit address latch circuit 72.

Of each of the commands sequentially read from command memory 9, the INST section and the MODE section are stored into registers 64 and 65, respectively. The INST section represents the type of the command. Of the MODE section, the lower three bits form a CH#subsection and an R/F subsection, and are input as an read address RADRS to input memory 7. The upper three bits of each command form data showing the condition of measuring the time of any change in the input signal, and are input to controller 66.

Figure 16A:
FIGS. 16A-16B are diagrams illustrating the function performed by the compensation circuit incorporated in the sequencer.
Figure 16B:
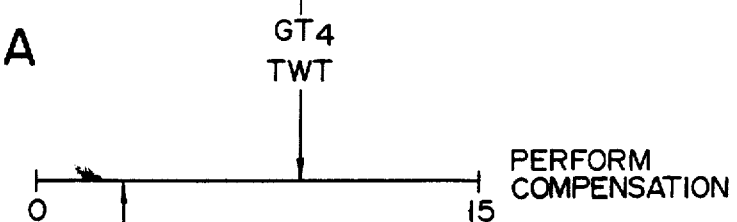

Compensation circuit 67 compensates the time data in accordance with the 4-bit data TWT read from input memory 7 and also with the 24-bit reference time data ($TO_0$ to $TO_{23}$) supplied from timer counter 4. The time represented by data TWT stored in input memory 7 is different from the present time GT represented by the reference time data ($TO_0$ to $TO_{23}$). If the lower four bits GT4 of time data GT and the determined time data TWT have the relationship shown in FIG. 16A, that is, if the notation of TWT<GT4 is established, the upper 20 bits of reference time data GT have not been updated. Hence, these upper 20 bits of data GT are not compensated and added to data TWT. The resultant data, represents the time at which the input signal has been changed. On the other hand, if the lower four bits GT4 of time data GT and the determined time data TWT have the relationship shown in FIG. 16B, that is, if the notation of TWT>GT4 is established, the upper 20 bits of reference time data GT have already been updated. Hence, one is taken from a valve represented by these upper 20 bits of data GT, and the resultant data is added to data TWT. The resultant data represents the time at which the input signal has been changed.

Figure 17:
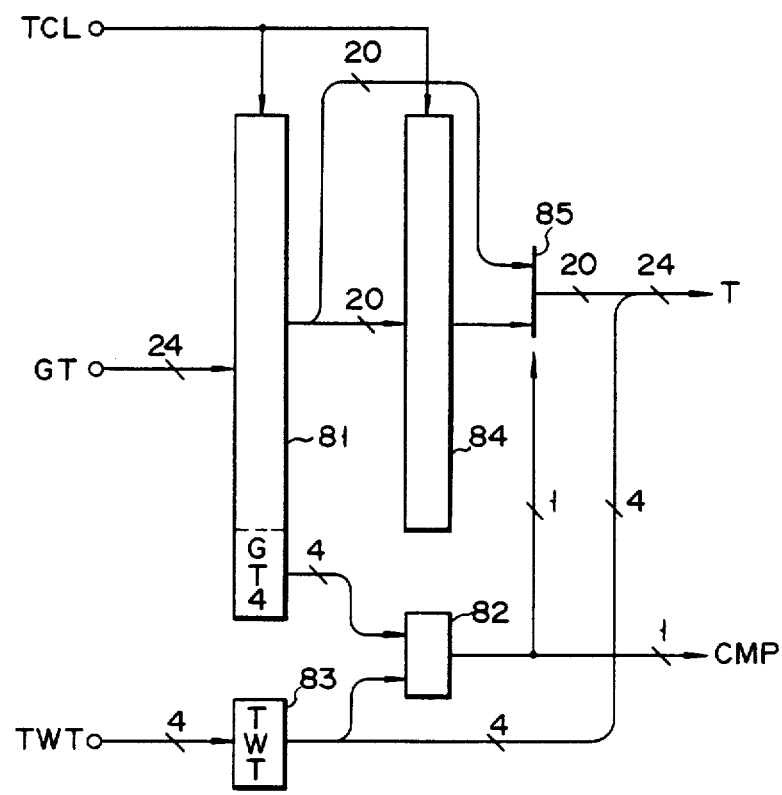
FIG. 17 is a block circuit diagram showing the compensation circuit used in the sequencer.

Compensation circuit 67 can be designed as is shown in FIG. 17, in order to determine the time of the change in the input signal, as described above. That is, circuit 67 has 24-bit register 81 for latching the reference time data GT output by timer counter 4. The lower four bits GT4 of data GT are inputted to one of the two input terminals of magnitude comparator 82. The data TWT output by input memory 7 is latched in 4-bit register 83, and is then inputted to the other input terminal of magnitude comparator 82. The upper 20 bits of data GT are input to 20-bit register 84. Registers 81 and 84 constitute a two-stage shift register. The TCL signal is supplied as a shift pulse to these registers 81 and 84 from timer counter 4. Thus, register 84 holds data (before update) obtained by decreasing one from a valve represented by the upper 20 bits stored in register 81. Compensation circuit further comprises data selector 85 for selecting the upper 20 bits stored in register 81, or the contents of register 84, in accordance with the output CMP of magnitude comparator 82. More specifically, selector 85 selects the contents of register 81 when GT4>TWT, since the output CMP of comparator 82 is "0". Conversely, selector 85 selects the contents of register 84 when GT4<TWT, since the output CMP is "1". The selected 20 bits are combined with the data TWT, thus forming data T which represents the time at which the input signal has changed.

The time data formed by compensation circuit 67 is supplied to register 70. The output CMP of magnitude comparator 82 is input to T2-validity check circuit 68. T2-validity check circuit 68 determines, in accordance with the WIDTH command, whether the second data T2 is valid or not. In other words, the second change of the input signal is detected in response to the WIDTH command. If the second change does not occur within the time period which can be stored in input memory 68, there is no problem. If the second change occurs within this time period, it is necessary to confirm whether this charge precedes or follows the other.

Assuming that the first change time TWT1, and the second change takes place at time TWT2, TWT1, TWT2, and the lower four bits GT4 will can have the six relationships shown in FIGS. 18A to 18F. When TW2, TWT1, and GT4 have relationship shown in FIG. 18A, 18C or 18E, T2-validity check circuit 68 determines that second time data TWT2 is valid since time TWT2 has been measured after time TWT1. In contrast, when TW2, TWT1, and GT4 have relationship shown in FIG. 18B, 18D or 18F, circuit 68 determines that second time data TWT2 is invalid since time TWT2 has been measured before time TWT1.

Figure 18A:
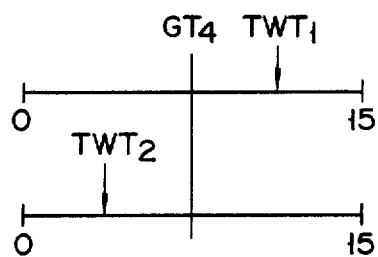
FIGS. 18A-18F are diagrams showing a T2-validity check circuit incorporated in the sequencer.
Figure 18B:
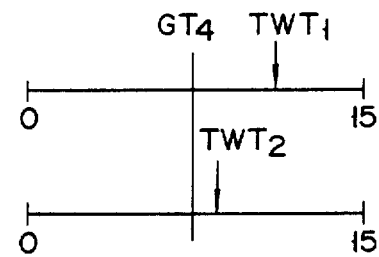
Figure 18C:
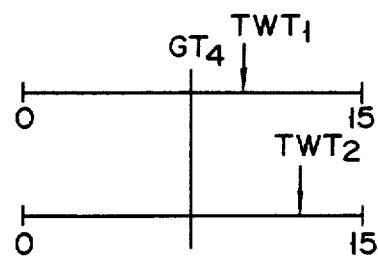
Figure 18D:
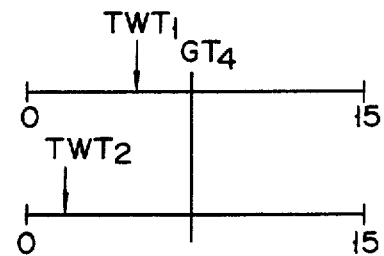
Figure 18E:
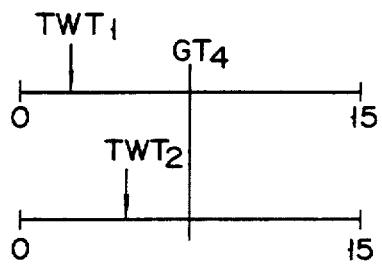
Figure 18F:
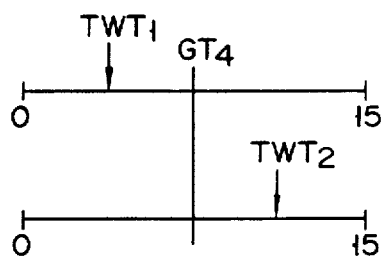

FIG. 19 illustrates the structure of T2-validity check circuit 68 which determines whether or not the second time data TWT2 is valid or not. As is shown in FIG. 19, T2-validity check circuit comprises 1-bit register 91, 4-bit register 92, 4-bit magnitude comparator 93, inverters 94 and 95, AND gates 96 to 98, and OR gate 99. Register 91 latches 1-bit data representing the relationship between data GT4 and data TWT1, i.e., the data CMP output by compensation circuit 67. More precisely, it stores "1" when TW1>GT4. Resistor 92 latches the value of data TWT1. These registers 91 and 92 latches the data items in response to a LATCH signal output by controller 66. Magnitude comparator 93 compares TWT1 latched in register 92 with the newly input TWT2, and produces a "1" signal when TWT1<TWT2. Inverter 94, AND gates 96 to 98, and OR gate 99 are logic circuits used to determine whether or not relationship shown in FIG. 18A, 18C or 18E is established. The output VALIDT of OR gate 99 is "1" when one of the following conditions is satisfied:

(1) TWT2<GT4, and TWT1>GT4
(2) TWT2>GT4, and TWT1>GT4, and TWT1<TWT2
(3) TWT2<GT4, and TWT1<GT4, and TWT1<TWT2

When the output VALIDT of T2-validity check circuit 68 is "1", controller 66 determines that the second data T2 is valid for the WIDTH command.

Controller 66, which controls the components of sequencer 7, comprises a PLA (Programmable Logic Array). Part of the INST section stored in register 64, and part of the MODE section stored in register 65 are read out from input memory 7 and supplied to controller 66. The VALID signal showing that the input signal has been changed, and the VALIDT signal representing that data T2 is valid are also input controller 66. Controller 66 functions a sequential circuit, by forming a feedback loop with registers 73 and 74 for storing state numbers. Controller 66 outputs to command memory 9 an MREQ signal for requesting an access to command memory 9, a RD/WR signal for reading data from, and writing data into, command memory 9, a CMDEND signal representing the completion of the execution of a command, and a WRCMD signal for instructing command memory 9 to store data. Controller 66 also outputs a RD signal to input memory 7, thereby reading data from input memory 7.

Command memory 9 can be accessed by not only CPU 3, but also by sequencer 8. It can store 32 words each formed of 16 bits, which are supplied from CPU 3, and 16 words each formed of 32 bits, which are supplied from sequencer 8. It can store 16 commands at the most. Memory 9 has the structure illustrated in FIG. 20. As is shown in this figure, command memory 9 comprises memory region formed of 16 bits×16 word memory plane 101, and 8 bit×16 word memory planes 102 and 103, and address decoder 104 for designating the addresses of these memory planes. The various commands are stored in the memory region formed of these memory planes 101, 102, and 103.

As is shown in FIG. 20, command memory 9 further comprises arbitration circuit 105, address selector 106, 16-bit latch circuit 107, and data selector 108. Circuit 105 arbitrates the request made by CPU 3 for an access to memory planes 101 to 103 with the request made by sequencer 8 to memory planes 101 to 103. Address selector 106 selects the address supplied from CPU or the address supplied from sequencer 8, in accordance with the data output by arbitration circuit 105. Latch circuit 107 latches the 16-bit command read from memory plane 101, until the time this command is supplied to CPU 3. Data selector 108 selects the 8-bit data supplied from CPU 3 or the 8-bit data supplied from sequencer 9.

In this embodiment, the time the sequencer requires to write data into, or read data from, command memory 9 is equal to the time interval of the pulses of the operation clock signal for sequencer 8, and the time the CPU requires to write data into, or read data from, command memory 9 is three times longer than the interval of the pulses of the operation clock signal for sequencer 8.

When CPU 3 writes data into, or read data from, command memory 9, the address is uncertain since the MREQ signal is invalid at the first clock pulse, as can be understood from FIG. 21. Arbitration circuit 105 has been designed on the assumption that sequencer 8 need not continuously access command memory 9 longer than two-pulse period. Hence, arbitration circuit 105 accepts the request made by sequencer 8, prior to the request made by CPU 3. During the period ①  shown in FIG. 21, only sequencer 8 can access command memory 9 since the address of the request made by CPU 3 has yet to be established. During the period ② and the period ③, both CPU 3 and sequencer 8 can have access to command memory 9. If sequencer 8 makes no requests for access during the period ②, CPU 3 can access memory 9 using this period, thereby to read data from memory 9 at time ④. If sequencer 8 need not access memory 9 during the period ③, CPU 3 can have access to memory 9 during this period, thereby to read data out of command memory 9 at time ⑤. Hence, CPU 3 can read data from command memory 9 at least once, at time ④ or time    . Latch 107 is therefore used to hold the data which has been read from the memory region and is to be supplied to CPU 3. Since sequencer 8 need not continuously access command memory 9 longer than two-pulse period, CPU 3 can access memory 9 during the period ② if sequencer 8 accesses memory 9 during the period ① or ③. If sequencer 8 accesses memory 9 during the period ②, CPU 3 can access command memory 9 during the period 3 .

However, when the address requested by CPU 3 is identical with the address requested by sequencer 8, this means that the command being executed have the address identical to the one requested by CPU 3. If this is the case, CPU 3 waits until sequencer 8 completely executes the command, in order to prevent sequencer 8 from executing the command erroneously, and to prevent CPU 3 from reading incomplete data from command memory 9.

Since the arbitration circuit 105 operates in the above-mentioned scheme, the wait time for the request made by either CPU 3 or sequencer 8 can be reduced to a minimum.

The operation of pulse input apparatus 1, which has been described above, will now be explained, with reference to the flow charts shown in FIGS. 22A to 22F.

In the embodiment, system clock signal SCK for updating timer counter 4 has a frequency six times higher than the frequency of the clock signal TWT for updating input memory 7. The time required for updating input memory 7 sixteen times is equivalent to 96 pulses of system clock signal SCK. All commands stored in memory 9 must, therefore, be executed within this time period.

While data is being written into input memory 7, or while clock pulse signal TWR stays at "1" level, sequencer 8 must be disabled in order that pulse input apparatus operates correctly. The time equivalent to sixteen of the 16 pulses must be required to disable sequencer 8. As a result, the time which can be used for execute all command is, thus, equivalent to only 80 pulses. Further, since each command must be executed only once, so as to prevent sequencer 8 from detecting the same change of the input signal twice or more times. Hence, when program counter 62 overflows, it must be stopped until the clock signal TWR rises to the "1" level. One-pulse time is required for stopping program counter 62. As a consequence, it is only 79-pulse time which sequencer 8 can use for execute the commands.

Figure 22B:
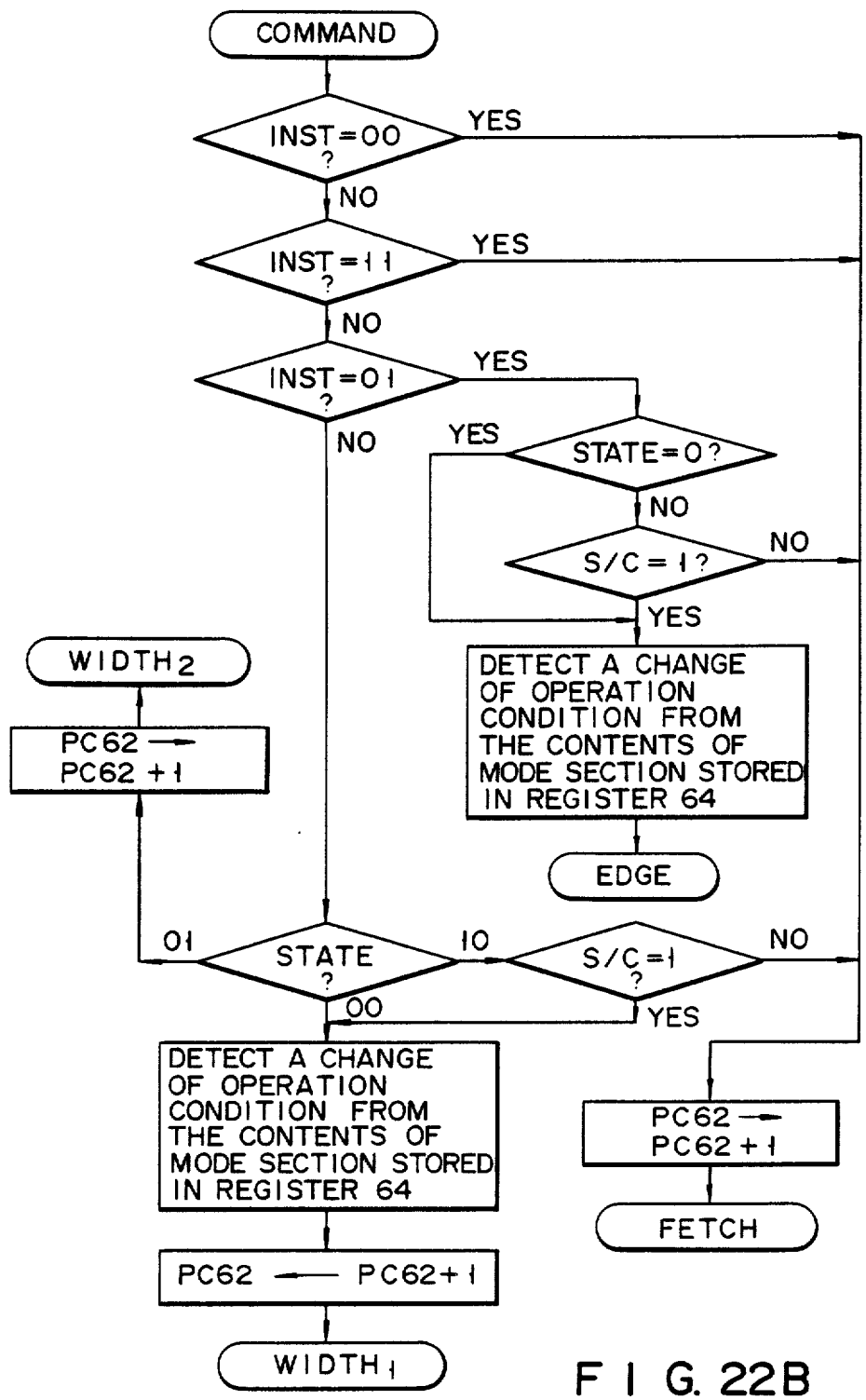

In FIG. 22A, period 1 denotes the period required for the preparatory process described above. During this period, the flow loops until clock signal TWR rises to the "1" level (Step 1). When clock signal TWR rises to the "1" level, program counter 62 and OVFR are reset to "0", whereby a command is read from memory 9 (Step 2). Then, it is determined whether or not program counter 62 has overflowed. If it does not overflow, the contents of program counter 62 are latched in latch circuit 72 for future use. The data from the address of command memory 9, which is designated by the contents of counter 62, is loaded into register 64. This loading of the data from the designated address requires one-pulse period. FIG. 22B shows the sequence of operations which are performed to analyze and identify each command, in accordance with the data of the INST section stored in register 64. If this data is "00", and a NOP command is identified, the count value of program counter 62 is updated, thus executing this NOP command. If the data at the INST section is "11", a WIDTH command is identified, and the process similar to the NOP command, i.e., updating of program counter 62 is carried out.

If the data of the INST section is "01", then an EDGE command is identified. In accordance with the contents of the STATE subsection and S/C subsection of the MODE section, it is determined whether or not the time of a change in the input signal must be measured. If STATE=0 or S/C=1 is satisfied, the time of the change is measured in accordance with a condition indicated by the MODE section as is illustrated in FIG. 22C. Otherwise, program counter 62 is updated, thus completing the execution of the command.

Figure 22D:
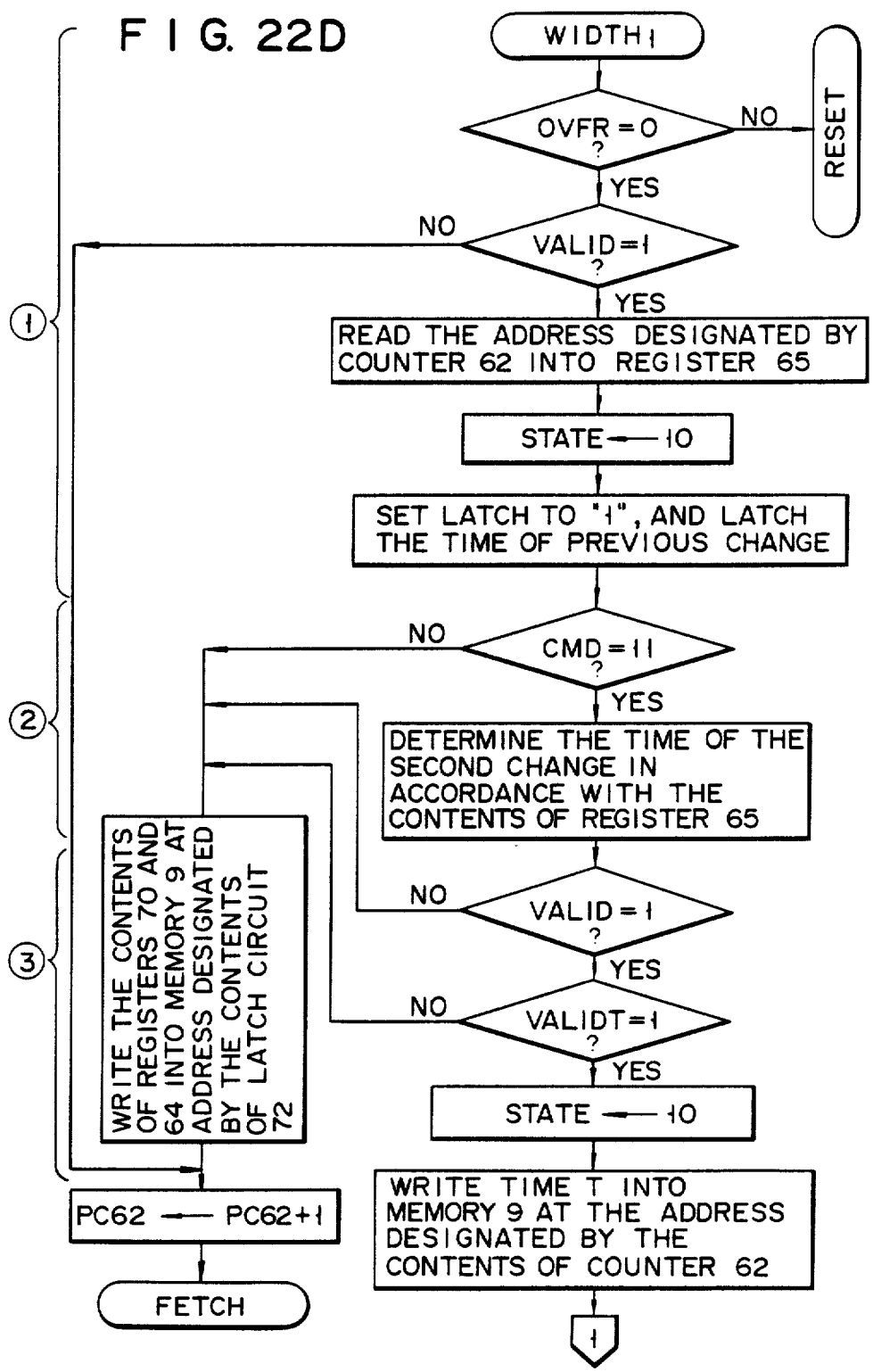
Figure 22E:
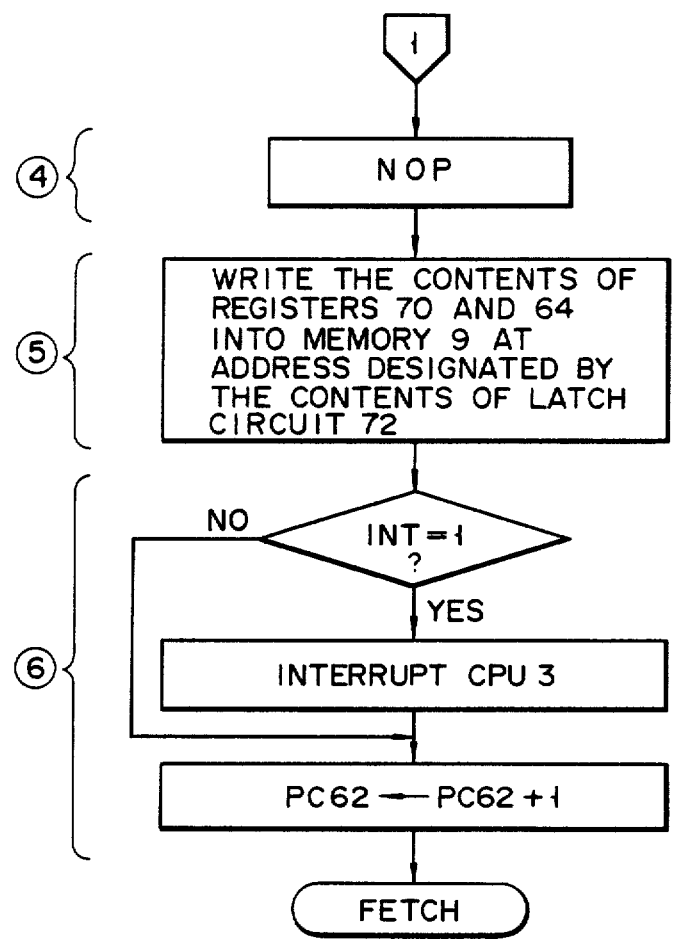
Figure 22F:
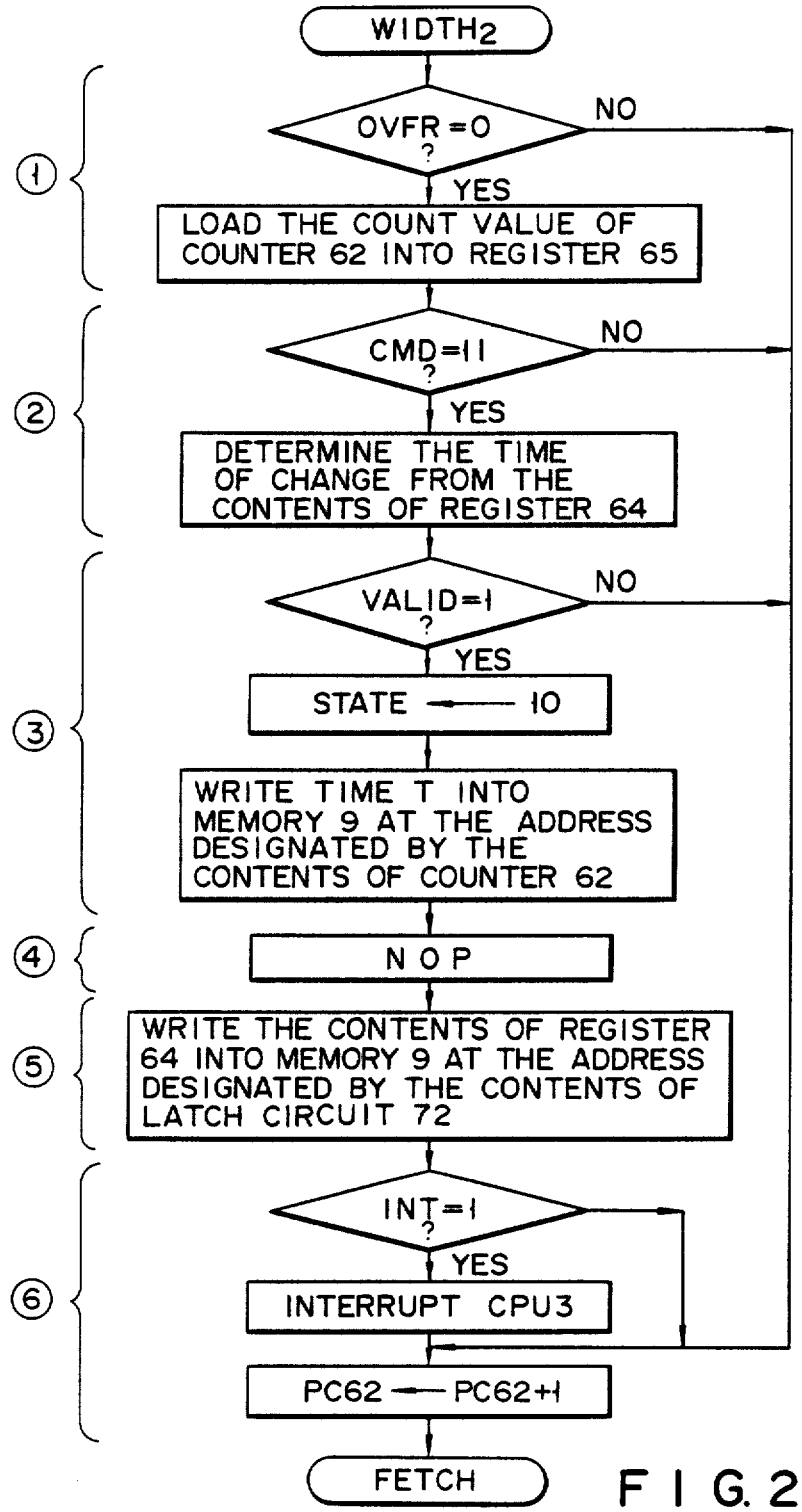

If the data of the INST section is "10", then a WIDTH command is identified. In accordance with the contents of the STATE subsection and S/C subsection of the MODE section, it is determined whether the time of the first change or the time of the second change must be measured, or the time of any change of the input signal has been measured. More precisely, when the STATE subsection are "00", the time of the first change is measured in accordance with the condition indicated by the MODE section, and program counter 62 is updated, whereby the sequence of operations shown in FIGS. 22D and 22E are carried out. When the STATE subsection is "01", the time of the second change is measured in accordance with the contents of the MODE section, program counter 62 is updated, whereby the sequence of operations shown in FIG. 22F is carried out. When the time of the change has been measured, the program counter 62 is updated, thus completing the execution of the WIDTH command. The process shown in FIG. 22B is performed during one-pulse period.

The EDGE command is executed as is shown in the flow chart of FIG. 22C. First, it is determined, from the VALID signal, whether or not the input signal has undergone changes. If VALID=1, the STATE subsection stored in register 64 is rewritten to "1". Then, time T and the contents of register 64 are written into command memory 9 (Step 1). It is then determined whether the INT subsection of the MODE section is "1" or not. If INT=1, CPU 3 is interrupted. Program counter 62 is updated, whereby the EDGE command is completely executed (Step 2). The process shown in FIG. 22C is performed during one-pulse period, too.

The WIDTH command is executed as is shown in the flow chart of FIG. 22D in order to measure the time of the first charge of the input signal. First, it is determined, from the signal VALID, whether or not the input signal has undergone changes. If VALID=1, the STATE portion stored in register 64 is rewritten to "10". Time T, at which the LATCH signal has been set to "1", is latched in register 70, whereby the next address is written into register 65 (Step 1). It is then determined whether the INST section stored in register 56 is "11" or not. If INST =11, the time of the second change is measured in accordance with the MODE section stored in register 65 (Step 2). Then, it is determined, from the signal VALID, whether or not the time thus determined is valid or not. If VALID=1, the STATE subsection stored in register 64 is rewritten to "10", whereby time T is written into command memory 9 at the address designated by the contents of program counter 62. If VALID≠1, the contents of registers 64 and 70 are written, as a command, into memory 9 at the address designated by the contents of latch circuit 72, and program counter 62 is updated, thus completing the execution of the WIDTH command (Step 3).

To prevent command memory 9 from being continuously accessed for a two-pulse period or a longer period, the operation is halted for a one-pulse period (Step 4). The contents of registers 64 and 70 are written, as a command, into command memory 9 at the address designated by the data latched by latch circuit 72 (Step 5). It is then determined whether the INT subsection of the MODE section is "1" or not. If INT=1, CPU 3 is interrupted program counter 62 is updated, thereby complete the execution of the WIDTH command (Step 6).

The time required to perform the sequence of operations shown in FIGS. 22D and 22E is a 6-pulse period at the longest.

The WIDTH command is executed to measure the time of change of the input signal, as is shown in the flow chart of FIG. 22F. First, the count value of program counter 62 is loaded into register 65 (Step 1). Then, it is determined whether the INST subsection stored in register 65 is "11" or not. If INST="11", the time of the second change of the input signal is measure in accordance with the MODE section stored in register 65 (Step 2). It is determined, from the signal VALID, whether the input signal has been changed or not. If VALID≠1, program counter 62 is updated, whereby the WIDTH command is completely executed. If VALID=1, the STATE subsection stored in register 64 is rewritten to "10", and time T is written into command memory 9 at the address designated by the count value of program counter 62 (Step 3). To prevent command memory 9 from being continuously accessed for a two-pulse period or a longer period, the operation is halted for a one-pulse period (Step 4). Then, the contents of register 65 is written into memory 9 at the address designated by the contents of latch circuit 72 (Step 5). It is determined whether the INT subsection of the MODE section is 1 or not. If INT=1, CPU 3 is interrupted (Step 6).

The time required for performing the sequence of operations shown in FIG. 22F is a 6-pluse period at most.

As has been described, a 2-pulse period is required to execute NOP command; a 4-pulse period, at most, is required to execute EDGE command; and a 8-pulse period, at most, is required to execute WIDTH command. Since a 4-pulse period is required for one command, a 64-pulse period (4 pulses × 16 bits), at most, is required to execute the commands stored in command memory 9. This period is shorter than the period equivalent to 79 clock pulses which number is specific to the capacity of input memory 7. Therefore, all commands stored in command memory 9 can be executed.

In the pulse input apparatus according to the present invention, the signals output by the various sensors are sequentially stored into the input memory. The sequencer reads these signals from the input memory in accordance with the commands supplied from the command memory. The time of a change of the input signal, i.e., operation condition each of the internal components of, for example, an automobile is determined from each signal, and the data showing this time is added to the command. Hence, even if the input signal has a complex waveform, the internal components can determine the time of a change of the operation condition from the signal, since the CPU can interrupt the command memory whenever necessary. The work load on the CPU can be reduced.

What is claimed is:

1. A pulse input apparatus comprising:
  a timer counter for counting predetermined clock pulses and for generating reference time data representing a present time;
  input circuit means for sampling an input signal, having at least one type of change in signal characteristics, in synchronism with the reference time data, and for outputting sampled signal data including data representative of the present time at which the change in signal characteristics of the input signal has occurred and the type of change in signal characteristics of the input signal;
  input memory means having a plurality of addresses for storing the sampled signal data of the input signal, as data items, in response to the reference time data, the addresses of said input memory means being designated by the reference time data, said input memory means having converting means for converting the sampled signal data of the input signal into a code representing at least the time at which the change in signal characteristics of the input signal has occurred;
  command memory means for storing commands for commanding a writing in of data items into the command memory means, the data items representing the type of change in signal characteristics of the input signal and the time at which the change occurred; and
  sequence means for sequentially reading the commands from said command memory means such that all commands are executed before the data items are stored in all of the addresses of said input memory means, said sequencer means including reading means for reading the code representing the time of change in the signal characteristics of the input signal from said input memory means, receiving means for receiving a count value from the timer counter which indicates the present time, determining means for determining the time of change of the signal characteristics of the input signal from the code and the present time, and adding means for adding the data representing the time thus determined to the command read out of the command memory means.

2. The pulse input apparatus according to claim 1, wherein said input circuit means samples a plurality of input signals input through a plurality of channels and outputs a plurality of sampled signal data corresponding to the input signals, and said input memory means comprises an orthogonal memory for storing the sampled signal data outputted by said input circuit means and represented conditions of the channels, as the data items, said input memory means including coding means for coding the data items corresponding to each of the channels.

3. The pulse input apparatus according to claim 1, wherein the at least one type of change in the signal characteristics of the input signal is at least one of a leading and trailing edge of the input signal, wherein said command memory means stores a command for commanding the writing in of data items into the command memory means designating the type of change in signal characteristics to be written in as being one of the leading edge and trailing edge of the input signal, and said sequencer includes comparing means for comparing the code from the input memory means representing the time of change of the signal characteristics of the input signal, with the reference time data of the timer counter indicating the present time, and means for outputting data representing the present time when the time of change indicated by the code is less than the present time, and for outputting data representing a preceding time when the time of change indicated by the code is grater than the present time indicated by the reference time data.

4. The pulse input apparatus according to claim 1, wherein said command memory means stores a command for commanding a writing in of the time of a first change of the input signal and the time of a second change thereof into said command memory, and said sequencer means includes comparing means for comparing the code generated by said input memory means showing the time of the first change, the code generated by said input memory means showing the time of the second change, and the present time as indicated by said reference time data, and includes means for validating data representing the times of the first and second changes when the comparison result is one of the following relationships: the time of the second change is less than the present time which is less than the time of the first change, the present time is less than the time of first change which is less than the time of the second change, and the time of the first change is less than the time of the second change which is less than the present time, and means for invalidating the data representing the times of the first and second changes when the time of the first change, the time of the second change and the present time have any other relationship.

5. A pulse input apparatus comprising:
a time counter for counting predetermined clock pulses and for generating reference time data;
input circuit means for sampling an input signal having at least one type of change in signal characteristics and for outputting a plurality of sampled signal data including at least sampled signal data representing the type and time of change of the input signal in response to the reference time data;
input memory means having a plurality of addresses for storing the sampled signal data sampled by the input circuit means, at the addresses designated by the reference time data in response to the reference time data, and encoding means for converting the sampled signal data of the input signal read out of the input memory means into a code representing at least the time at which the input signal has changed;
command memory means for storing commands for commanding a writing in of data items into the command memory means, the data items representing the type of change of the input signal and the time at which the change has occurred; and
sequencer means including means connected to said command memory means for sequentially reading commands from said command memory means such that all commands are executed before the data items are stored at all addresses of said input memory means, reading means connected to said input memory means and said timer counter for reading the code from the input memory means which represents the time of change of the input signal, and receiving means connected to said timer counter for receiving data outputted by said timer counter representing the present time, when the writing in of the time of change of the signal into the command memory means is commanded by the command read out of the command memory means, determining means connected to said reading means for determining the time of change of the input signal from the relationship between the code and the present time, and adding means connected to said determining means for adding data representing the time thus determined, to the command read out of the command memory means.

6. The pulse input apparatus according to claim 5, wherein said memory means comprises an n×m bit orthogonal memory, and said input memory means has a first address means for inputting addresses to said orthogonal memory such that the sampled signal components of the input signal are stored at addresses arranged in a first direction, and a second address means for inputting addressed to said orthogonal memory such that the sampled signal components of the input signal are read out in a second direction intersecting with the first direction.

7. The pulse input apparatus according to claim 6, wherein said command memory means has latch means for temporarily storing a command read out from said memory plane.

8. The pulse apparatus according to claim 5, further comprising a CPU connected to said command memory means and an arbitration means connected to said command memory means and wherein said command memory means comprises at least one memory plane, address means for designating addresses of the memory plane, and said arbitration means arbitrates an access request made by said CPU with an access request made by said sequencer means to prevent conflicts therebetween.

9. The pulse input apparatus according to claim 5, wherein the determining means for determining the time of the change measures a pulse cycle of said input signal, and then determines said time from the measured pulse cycle.

10. The pulse input apparatus according to claim 5, wherein the means for determining the time of the change measures a phase difference between at least two input signals, and then determines said time from the measured phase difference.

11. The pulse input apparatus according to claim 5, wherein said sequencer means has comparing means for comparing the time of change of the input signal as provided by the code generated by the input memory means with a present time as indicated by the reference time data of the timer counter and for outputting data representing the present time when the time of change of the input signal is less than the present time and for outputting data representing a preceding time when the time of change is greater than the present time.

* * * * *